US012580681B2

(12) United States Patent
Cheng et al.

(10) Patent No.: US 12,580,681 B2
(45) Date of Patent: Mar. 17, 2026

(54) COMMUNICATION METHOD AND APPARATUS

(71) Applicant: HUAWEI TECHNOLOGIES CO., LTD., Shenzhen (CN)

(72) Inventors: Xingqing Cheng, Beijing (CN); Lili Jin, Chengdu (CN); Jian Wang, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 35 days.

(21) Appl. No.: 18/592,082

(22) Filed: Feb. 29, 2024

(65) Prior Publication Data

US 2024/0204915 A1 Jun. 20, 2024

Related U.S. Application Data

(63) Continuation of application No. PCT/CN2022/114877, filed on Aug. 25, 2022.

(30) Foreign Application Priority Data

Sep. 1, 2021 (CN) .......................... 202111022666.3

(51) Int. Cl.
| | |
|---|---|
| *H04L 1/00* | (2006.01) |
| *H03M 13/09* | (2006.01) |
| *H04W 28/18* | (2009.01) |

(52) U.S. Cl.
CPC .......... *H04L 1/0061* (2013.01); *H03M 13/09* (2013.01); *H04W 28/18* (2013.01)

(58) Field of Classification Search
CPC ... H04L 1/0061; H04L 1/0006; H04L 1/0009; H04L 1/0041; H03M 13/09; H04W 28/18
See application file for complete search history.

(56) References Cited

U.S. PATENT DOCUMENTS 8,555,148 B2 * 10/2013 Pi .......................... H04L 1/0083
714/755
8,634,366 B2 * 1/2014 Kim ...................... H04L 1/0042
370/335

(Continued)

FOREIGN PATENT DOCUMENTS

| CN | 101615986 A | 12/2009 |
|---|---|---|
| CN | 106888072 A | 6/2017 |
| CN | 107196740 A | 9/2017 |

OTHER PUBLICATIONS

Nokia, Alcatel-Lucent Shanghai Bell: "Considerations for CRC attachment," 3GPP TSG RAN WG1 #88bis Meeting, Spokane, WA, U.S.A, R1-1705855, total 4 pages, 3rd Generation Partnership Project, Valbonne, France (Apr. 3-7, 2017).

*Primary Examiner* — Albert Decady
*Assistant Examiner* — Grace V Braden
(74) *Attorney, Agent, or Firm* — Leydig, Voit & Mayer, Ltd.

(57) ABSTRACT

Disclosed are a communication method and apparatus applied to the field of communication technologies. The method includes: processing a first transport block (TB) in a target check code addition manner in a plurality of check code addition manners, to obtain first data, where the first data includes M code blocks (CBs), and M is a positive integer; generating at least one codeword based on the M code blocks; and sending the at least one codeword. Correspondingly, a communication system, a computer-readable storage medium, and a computer program are further provided. According to this application, transmission performance can be improved, and data transmission efficiency can be improved.

20 Claims, 10 Drawing Sheets

(56)          References Cited

U.S. PATENT DOCUMENTS

| | | | |
|---|---|---|---|
| 10,469,212 B2 * | 11/2019 | Xu | H04L 1/00 |
| 10,819,372 B2 * | 10/2020 | Noh | H03M 13/09 |
| 11,063,699 B2 * | 7/2021 | Noh | H04L 1/0015 |
| 2009/0319878 A1 * | 12/2009 | Kaburaki | H03M 13/2906 |
| | | | 714/E11.032 |
| 2017/0279464 A1 | 9/2017 | Noh et al. | |
| 2017/0359150 A1 * | 12/2017 | Xu | H03M 13/09 |

* cited by examiner

201

First node

202

Second node

FIG. 2

First node

Second node

S301: Process a first TB in a target check code addition manner in a plurality of check code addition manners, to obtain first data, where the first data includes M CBs S302: Generate at least one codeword based on the M CBs S303: Send the at least one codeword S304: Process the at least one codeword in the target check code addition manner in the plurality of check code addition manners, to obtain information about the first TB

FIG. 3

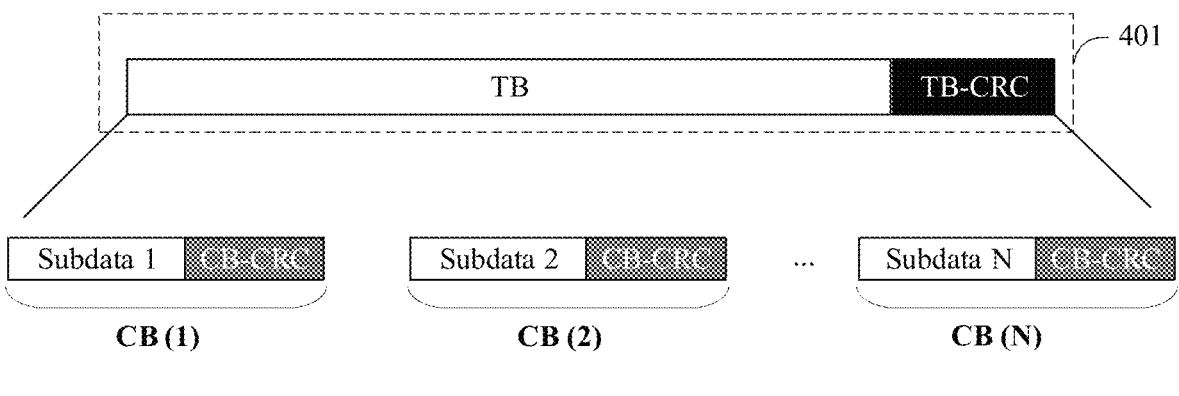

| Preamble | Header (header) | | | Data part (payload) | Another field |
|---|---|---|---|---|---|
| | Check code addition manner indication field | Segmentation manner indication field | Another field | | |

| Preamble | Header (header) | | Data part (payload) | Another field |
|---|---|---|---|---|
| | Check code addition manner indication field | Another field | | |

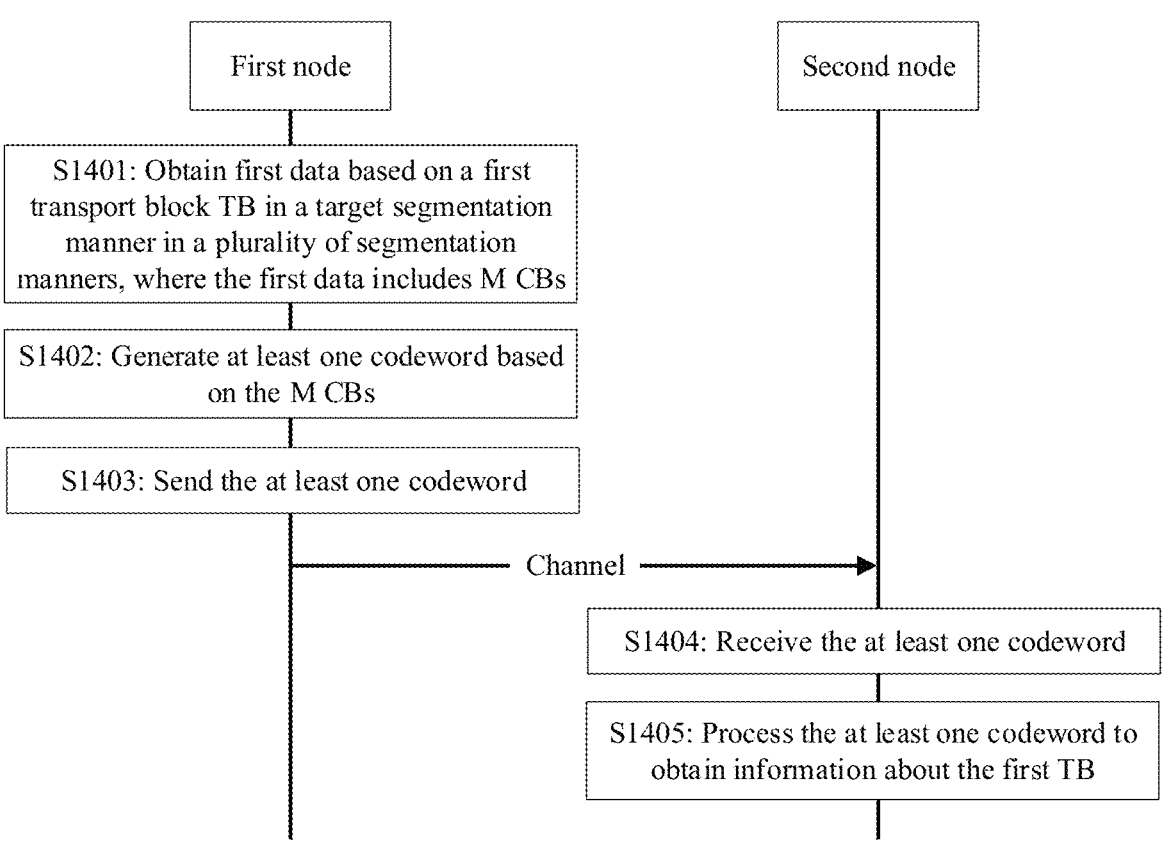

S1401: Obtain first data based on a first transport block TB in a target segmentation manner in a plurality of segmentation manners, where the first data includes M CBs S1402: Generate at least one codeword based on the M CBs S1403: Send the at least one codeword Channel S1404: Receive the at least one codeword S1405: Process the at least one codeword to obtain information about the first TB

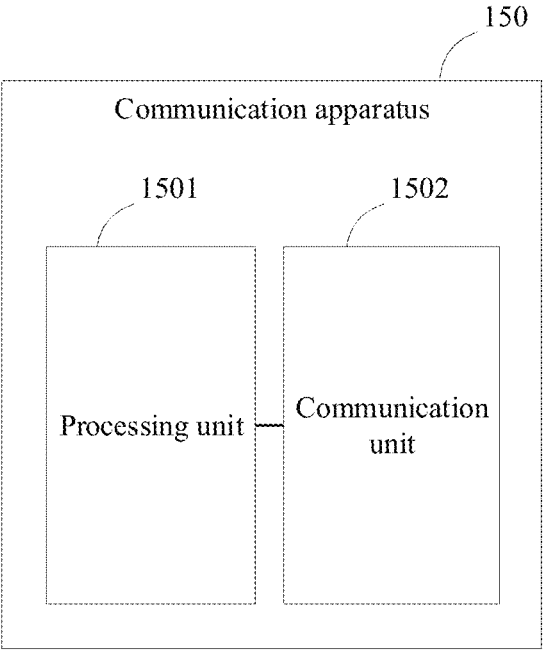

Communication apparatus

1501

1502

Processing unit

Communication unit

FIG. 15

COMMUNICATION METHOD AND APPARATUS

CROSS-REFERENCE TO RELATED APPLICATIONS

This application is a continuation of International Patent Application No. PCT/CN2022/114877, filed on Aug. 25, 2022, which claims priority to Chinese Patent Application No. 202111022666.3, filed on Sep. 1, 2021. The disclosures of the aforementioned applications are hereby incorporated by reference in their entireties.

TECHNICAL FIELD

This application relates to the field of communication technologies, and in particular, to a communication method and apparatus.

BACKGROUND

With the continuous development of global communication technologies, a development speed and application of wireless communication technologies are in full swing. Smart terminals based on wireless communication technologies, such as smart transportation devices, smart home devices, and robots, are gradually entering people's daily life. The wireless communication technologies are widely used in terminals due to advantages such as convenient connection, good scalability, and easy maintenance. In an example in which a smart transportation device is a vehicle, in-vehicle wireless communication can further reduce a quantity of harnesses, a length of the harness, and a weight of the harness in the vehicle, and corresponding installation or maintenance costs. This makes in-vehicle communication technologies gradually develop toward wireless.

As applications are diversified, a quantity and types of nodes in a vehicle are increasing, and a higher requirement is imposed on an in-vehicle communication capability. For example, to improve a reliability requirement for in-vehicle communication, a transmit end needs to add a cyclic redundancy check (CRC) to data, and a receive end determines, by using the CRC, whether the data sent by the transmit end is accurately received.

During data transmission in a current communication system, a transport block (TB) is divided into a plurality of code blocks (CBs), and each CB includes a CRC. A receive end may check, based on the CRC of each CB, whether each CB is correctly received, so that a transmit end may resend only an incorrect CB. An advantage is that data reliability can be improved, and an amount of retransmitted data can be reduced. However, in this manner in which each CB includes a CRC, a proportion of the CRC in transmitted bits increases, a transmission code rate is reduced, and transmission performance is affected. Especially, in some applications that do not require high reliability, or in some cases in which only whether a transport block is correct needs to be learned, or for some broadcast/multicast channels, the manner in which a CRC is added to each CB does not bring more benefits in terms of reliability, but reduces data transmission efficiency, increases a delay, and affects transmission performance.

SUMMARY

Embodiments of this application provide a communication method and apparatus, to improve transmission performance and data transmission efficiency.

According to a first aspect, an embodiment of this application provides a communication method, including:

processing a first TB in a target check code addition manner in a plurality of check code addition manners, to obtain first data, where the first data includes M CBs, the plurality of check code addition manners are predefined or preconfigured, and M is a positive integer:

generating at least one codeword based on the M code blocks; and sending the at least one codeword.

The code block may be data or a data sequence that is input to an encoder. The codeword may be data obtained through the encoder. A code length may be a length of a codeword (or a length of data output by an encoder).

According to the foregoing aspect, the target check code manner may be determined from the plurality of check code addition manners, and a check code is added to a TB (and/or some data in the TB) in the target check code manner. Because a check code addition manner can be flexibly determined, a check code addition manner applicable to a current scenario (or a channel type, a type of a transmitted message, a code rate, or the like) can be determined for different transmission scenarios (or a channel type, a type of a transmitted message, a code rate, or the like), to improve transmission performance.

For example, when data is transmitted or broadcast information is sent through a broadcast channel, a code block may not include a check code, to increase a code rate, so as to improve data transmission efficiency, and reduce a delay.

For another example, when channel quality is good, a code block may not include a check code, to improve data transmission efficiency.

For another example, in some scenarios, a check code may be added to a transport block, a check code is separately added to some subdata, and one check code is added to all the other subdata. This improves flexibility of adding a check code and improves data transmission efficiency.

Optionally, the method is applicable to any communication node having a communication function, for example, a transmit node.

In a possible implementation of the first aspect, the method is implemented at a physical layer of wireless communication. The physical layer is implemented on a bottom-layer hardware device, and the bottom-layer hardware device has a relatively strong processing capability and can perform various operations more quickly. Therefore, processing of adding a check code at the physical layer can reduce time overheads for calculating the check code, improve data transmission efficiency, and reduce a delay.

In a possible implementation of the first aspect, the method further includes: sending first indication information, where the first indication information indicates the target check code addition manner in the plurality of check code addition manners. In this implementation, the transmit node may send the first indication information, to indicate, to a receive side, a used check code addition manner. In this case, the transmit node may flexibly determine an applicable check code addition manner from the plurality of check code addition manners, and indicate the applicable check code addition manner to the receive end by using the indication information.

Optionally, the first indication information may be sent when a communication connection is established between a transmit node and a receive end, or may be sent after a connection is established, or may be sent when specific information is transmitted.

Further, optionally, a first node and a second node may negotiate a to-be-used check code addition manner in a process of establishing a connection. Alternatively, a first node or a second node notifies, by using the first indication information, a peer end of a check code addition manner that should be used.

In another possible implementation of the first aspect, the first indication information is sent by using signaling. The signaling may include, for example, one or more of broadcast information, a system message, higher layer configured signaling, media access control signaling, and the like.

In another possible implementation of the first aspect, the first indication information is carried in a header of a frame. The frame is a transmission unit. The header of the frame is also referred to as a frame header, and may include one or more fields. Specifically, the first indication information may be transmitted by using a field in the frame header. In this implementation, the header of the frame includes the first indication information, and the receive end may determine the target check code addition manner based on the header of the frame.

In a design, the first indication information may indicate a check code addition manner used for a data part of a frame, and a target check code addition manner used for any frame may be flexibly set. This further improves flexibility.

In another possible implementation of the first aspect, there is a correspondence between the target check code addition manner and one or more of the following information: a communication channel type, a communication scenario type, a channel quality indication, a communication capability of a node, a code rate, or a radio frame type. The communication capability of the node (which may also be referred to as a capability of the node) may include one or more of the following aspects: a check code addition manner supported by the node, a check capability of the node, and the like, and include indication information for the aspects. In this way, a target check code addition manner applicable to a current communication condition can be determined, to improve transmission efficiency.

For example, a first node and a second node may negotiate a to-be-used check code addition manner in a process of establishing a connection. Alternatively, during each time of communication, the transmit end or the receive end notifies a peer end of a check code addition manner that should be used.

In another possible implementation of the first aspect, the target check code addition manner is a check code addition manner supported by a receive end in the plurality of check code addition manners. In a design, the receive end may feed back, to the transmit end, a check code addition manner supported by the receive end, and the transmit end determines the target check code addition manner from the check code addition manner supported by the receive end.

In another possible implementation of the first aspect, the correspondence is predefined, preconfigured, or negotiated.

In another possible implementation of the first aspect, the target check code addition manner is a first check code addition manner in the plurality of check code addition manners:

the first TB and a first cyclic redundancy check CRC jointly correspond to N pieces of subdata, the first CRC is a CRC corresponding to the first TB, and N is a positive integer:

the M CBs include M1 first CBs, each first CB includes one piece of subdata and a second CRC, the second CRC is a CRC corresponding to the one piece of subdata, and $M1 \geq 0$; and

4 the M CBs include M2 second CBs, the M2 second CBs correspond to N1 pieces of subdata and a third CRC, the third CRC is a CRC jointly corresponding to the N1 pieces of subdata, $M2 \geq 0$), and $N1 \geq 0$.

In the foregoing implementation, some subdata includes a separate CRC, and some subdata (jointly) corresponds to the third CRC. In this way, a calculation amount for calculating the check code can be reduced, and a proportion of the check code in transmitted bits can be reduced, to improve transmission efficiency.

In another possible implementation of the first aspect, a code length corresponding to the first CB is a first code length; and a code length corresponding to the second CB is a second code length, and the first code length is different from the second code length.

In the foregoing implementation, for CBs of some code lengths, each CB includes a CRC, and the CBs of some code lengths correspond to one CRC.

In another possible implementation of the first aspect, $M2+N1=N$.

In another possible implementation of the first aspect, the M CBs include M3 third CBs, the M3 third CBs correspond to M3 pieces of subdata, the third CB does not include a CRC, $M3>0$), and $N \geq 20$.

In another possible implementation of the first aspect, the target check code addition manner is a second check code addition manner in the plurality of check code addition manners; and the first TB and a first CRC jointly correspond to the M CBs, and the first CRC is a CRC corresponding to the first TB.

In the foregoing manner, a CRC is added to a TB, and a CB obtained by dividing the TB does not include a separate CRC. In some scenarios (for example, a scenario in which a signal-to-noise ratio is relatively high, or a receive end does not support a CB or CBG feedback), there is no need to include a CRC in each CB to determine whether the CRC of each CB succeeds, but the first CRC is used to check whether the first TB is correctly transmitted. In this case, a code rate for transmitting bits can be improved, to improve transmission efficiency.

In another possible implementation of the first aspect, the target check code addition manner is a third check code addition manner in the plurality of check code addition manners; and the first TB and a first CRC of the first TB jointly correspond to M pieces of subdata, and the first CRC is a CRC corresponding to the first TB; and each of the M CBs includes one piece of subdata and a second CRC, and the second CRC is a CRC corresponding to the one piece of subdata.

In the foregoing manner, each CB includes a separate CRC, and a CRC is added to each TB. The receive end may check, based on the CRC of each CB, whether each CB is correctly received, so that the transmit end may resend only an incorrect CB. This reduces system overheads in a retransmission scenario, improves data transmission efficiency, and improves transmission performance.

In another possible implementation of the first aspect, the processing a first TB in a target check code addition manner in a plurality of check code addition manners, to obtain first data includes:

adding the first CRC to the first TB in the target check code addition manner in the plurality of check code addition manners, to obtain a TB with a check code; and

segmenting the TB with the check code in a target segmentation manner in a plurality of segmentation manners, to obtain the M CBs.

Optionally, the plurality of check code addition manners may be predefined or preconfigured. For example, the plurality of check code addition manners are defined by using a protocol. Alternatively, when a node is delivered from a factory, the plurality of check code addition manners are written into the node. Alternatively, the plurality of check code addition manners are configured in a node by using a communication interface.

In the foregoing implementation, the transmit end supports a plurality of TB segmentation manners. When the transport block is segmented, the transmit end may determine the target segmentation manner from the plurality of segmentation manners, and segment the TB in the target segmentation manner. Because the segmentation manner can be flexibly determined, a segmentation manner applicable to a current scenario can be determined in different transmission scenarios. This improves transmission performance.

In another possible implementation of the first aspect, the segmentation operation is implemented at an object layer of wireless communication. Segmentation at the physical layer can reduce time overheads for calculating a check code, improve data transmission efficiency, and reduce a delay.

In another possible implementation of the first aspect, the target segmentation manner is a first segmentation manner in the plurality of segmentation manners; and the M CBs include at least one third CB, and a code length corresponding to the third CB is a shortest code length in a plurality of predefined code lengths.

The foregoing enumerates a possible segmentation manner. A plurality of CBs may be obtained through processing based on a TB, and the plurality of CBs definitely need to include a block with a shortest code length. In this way, when decoding the plurality of CBs, the receive end may perform decoding in a pipeline form. A decoding delay is low: The pipeline decoding may mean that when a decoding module completes decoding of a former CB, a latter CB can already wait for decoding. For example, code lengths of CBs include a code length of 128 and a code length of 64. Because a granularity of a CB with a code length of 64 is fine, decoding time is flexible. The receive end decodes a CB with a length of 128. After decoding of the CB with the length of 128 is completed, the decoding module may immediately decode the CB with the code length of 64. This improves decoding efficiency, and a decoding delay is low: If code lengths of CBs include a code length of 256 and a code length of 64, it is possible that data with the code length of 64 is completely received, but decoding for the code length of 256 is not completed, and decoding for the code length of 64 can be performed only after decoding for the code length of 256 is completed.

In another possible implementation of the first aspect, the target segmentation manner is a second segmentation manner in the plurality of segmentation manners.

The M CBs do not necessarily include a third CB. A code length corresponding to the third CB is a shortest code length in a plurality of predefined code lengths.

For example, if the plurality of predefined code lengths are {1024, 512, 256, 128, 64}, the M CBs may include a CB whose corresponding code length is 64, or may not include a CB whose corresponding code length is 64.

In a possible implementation, a code length of any one of the M CBs is greater than a shortest code length in a plurality of predefined code lengths.

In a possible implementation, code lengths corresponding to the M CBs are related to a length of the TB. For example, if a data length of the first TB is a first data length, a code length corresponding to any one of the M CBs is greater than a shortest code length in a plurality of predefined code lengths; or if a data length of the first TB is a second data length, the M CBs include at least one third CB, and a code length corresponding to the third CB is a shortest code length in a plurality of predefined code lengths. The first data length may include at least one piece of data, or may include a plurality of data lengths, or may be one or more data length ranges. Similarly, the second data length may include at least one piece of data, or may include a plurality of data lengths, or may be one or more data length ranges.

The foregoing enumerates another possible segmentation manner. Code lengths of CBs obtained through division may be long (not necessarily including a block with a shortest code length). For a TB with a same length, fewer CBs may be obtained. This can reduce time consumption during check code calculation, increase a code rate, and improve data transmission efficiency.

In another possible implementation of the first aspect, the method further includes: sending second indication information, where the second indication information indicates the target segmentation manner in the plurality of segmentation manners. In this implementation, the transmit node may send the second indication information, to indicate, to a receive side, a used segmentation manner. In this case, the transmit node may flexibly determine an applicable segmentation manner from the plurality of segmentation manners, and indicate the applicable segmentation manner to the receive end by using the indication information.

Optionally, the second indication information may be sent when a communication connection is established between a transmit node and a receive end, or may be sent after a connection is established, or may be sent when specific information is transmitted.

Optionally, the first indication information and the second indication information may be same indication information. For example, there is a correspondence between a check code addition manner and a segmentation manner. When the first check code addition manner is used, the first segmentation manner is also used. In this case, the first indication information may indicate the first check code addition manner, so that the first segmentation manner may also be indicated.

In another possible implementation of the first aspect, the second indication information is sent by using signaling. The signaling may include, for example, one or more of broadcast information, a system message, higher layer configured signaling, media access control signaling, and the like.

In another possible implementation of the first aspect, the second indication information is carried in a header of a frame. The frame is a transmission unit. Optionally, the second indication information may be specifically transmitted by using a field in the frame header.

In this implementation, the target segmentation manner is indicated by using a header of a transmission unit. In this way, a segmentation manner used by any transmission unit can be flexibly set, to further improve flexibility. In addition, the header of the transmission unit is used for indication, and the receive side may determine the segmentation manner based on the header of the transmission unit, so that signaling overheads can be reduced, and communication efficiency can be improved.

In another possible implementation of the first aspect, a code length L corresponding to the CB satisfies the following equation:

$$L=2^n, \text{ where n is a natural number.}$$

The code block is enabled to meet a code length in a form of a positive integer power of 2, so that a codeword obtained by encoding the code block is directly sent or a codeword is received by using a specific code rate, and no additional rate matching module needs to be configured. This simplifies an encoding/decoding process and reduces system power consumption. In a design, the foregoing implementation is implemented based on a polar code. The code block is enabled to meet a code length in a form of a positive integer power of 2, so that a polar code encoding/decoding system design can be effectively simplified, and system power consumption of polar code encoding/decoding can be reduced.

In another possible implementation of the first aspect, a code length corresponding to the CB is one or more of predefined code lengths, and the predefined code lengths include at least one of 1024, 512, 256, 128, 64, or the like.

The predefined code length meets a form of a positive integer power of 2, so that an encoding/decoding process can be simplified, and system power consumption can be reduced.

According to a second aspect, an embodiment of this application provides a communication method, including:

receiving at least one codeword; and processing the at least one codeword in a target check code addition manner in a plurality of check code addition manners, to obtain information about a first TB, where the plurality of check code addition manners are predefined or preconfigured.

Optionally, the method is applicable to any communication node having a communication function, for example, a receive node.

In a possible implementation of the second aspect, the foregoing method is implemented at an object layer of wireless communication.

In another possible implementation of the second aspect, the information about the first TB includes one or more of the following information: the first TB, a check result of the first TB, subdata corresponding to at least one CB, a check result of at least one CB, subdata corresponding to at least one code block group (CBG), or a check result of at least one CBG.

In another possible implementation of the second aspect, the method further includes: receiving first indication information, where the first indication information indicates the target check code addition manner in the plurality of check code addition manners.

In another possible implementation of the second aspect, the method further includes: receiving first indication information by receiving signaling.

In another possible implementation of the second aspect, the first indication information is carried in a header of a frame. The frame is a transmission unit. The header of the frame is also referred to as a frame header, and may include one or more fields. Specifically, the first indication information may be transmitted by using a field in the frame header.

In another possible implementation of the second aspect, there is a correspondence between the target check code addition manner and one or more of the following information: a communication channel type, a communication scenario type, a channel quality indication, a communication capability of a node, a code rate, or a radio frame type.

In another possible implementation of the second aspect, the correspondence is predefined, preconfigured, or negotiated.

In another possible implementation of the second aspect, the target check code addition manner is a check code addition manner supported by a receive end in the plurality of check code addition manners. In a design, the receive end may feed back, to the transmit end, a check code addition manner supported by the receive end, and the transmit end determines the target check code addition manner from the check code addition manner supported by the receive end.

In another possible implementation of the second aspect, the processing the at least one codeword in a target check code addition manner in a plurality of check code addition manners, to obtain information about a first TB includes:

obtaining M CBs based on the at least one codeword, where M is a positive integer; and checking the M CBs in the target check code addition manner in the plurality of check code addition manners, to obtain the information about the first TB.

In another possible implementation of the second aspect.

the first TB and a first cyclic redundancy check CRC jointly correspond to N pieces of subdata, the first CRC is a CRC corresponding to the first TB, and N is a positive integer:

the M CBs include M1 first CBs, each first CB includes one piece of subdata and the first CRC, the first CRC corresponds to the one piece of subdata, and M1>0); and the M CBs include M2 second CBs, the M2 second CBs correspond to N1 pieces of subdata and a third CRC, the third CRC is a CRC jointly corresponding to the N1 pieces of subdata, M2≥0), and N1≥0).

In another possible implementation of the second aspect, the checking the M CBs in the target check code addition manner in the plurality of check code addition manners, to obtain the information about the first TB includes:

for the M1 second CBs, checking, based on a second CRC included in each first CB, whether subdata corresponding to the first CB is correctly transmitted; and for the M2 second CBs, checking, based on the third CRC, whether the N1 pieces of subdata are correctly transmitted.

In another possible implementation of the second aspect, the method further includes:

when M1 pieces of subdata corresponding to the M1 second CBs are correctly transmitted and the N1 pieces of subdata are correctly transmitted, obtaining a first TB with a check code based on the M1 pieces of subdata and the N1 pieces of subdata, where the first TB with the check code includes the first TB and the first CRC; and checking the first TB based on the first CRC, to obtain the first TB or the check result of the first TB.

In another possible implementation of the second aspect, a code length corresponding to the first CB is a first code length; and a code length corresponding to the second CB is a second code length, and the first code length is different from the second code length.

In another possible implementation of the second aspect, M2+N1=N.

In another possible implementation of the second aspect, the M CBs include M3 third CBs, the M3 third CBs correspond to N2 pieces of subdata, the third CB does not include a CRC, M320, and N2≥0).

In another possible implementation of the second aspect, the first TB and a first CRC jointly correspond to the M CBs, and the first CRC is a CRC corresponding to the first TB.

In another possible implementation of the second aspect, the checking the M CBs in the target check code addition manner in the plurality of check code addition manners, to obtain the information about the first TB includes:

obtaining a first TB with a check code based on the M CBs, where the first TB with the check code includes the first TB and the first CRC; and checking the first TB based on the first CRC, to obtain the first TB or the check result of the first TB.

In another possible implementation of the second aspect, the first TB and a first cyclic redundancy check CRC of the first TB jointly correspond to M pieces of subdata; and each CB includes one piece of subdata and a second CRC corresponding to the one piece of subdata.

In another possible implementation of the second aspect, the checking the M CBs in the target check code addition manner in the plurality of check code addition manners, to obtain the information about the first TB includes:

for the M CBs, checking, based on the second CRC included in each CB, whether the subdata included in each CB is correctly transmitted:

when the M pieces of subdata are correctly transmitted, obtaining a first TB with a check code based on the M pieces of subdata, where the first TB with the check code includes the first TB and a first CRC; and checking the first TB based on the first CRC, to obtain the first TB or the check result of the first TB.

In another possible implementation of the second aspect, the M CBs are obtained in a target segmentation manner in a plurality of segmentation manners.

In another possible implementation of the second aspect, the target segmentation manner is a first segmentation manner in the plurality of segmentation manners; and the M CBs include at least one third CB, and a code length corresponding to the third CB is a shortest code length in a plurality of predefined code lengths.

In another possible implementation of the second aspect, the target segmentation manner is a second segmentation manner in the plurality of segmentation manners.

The M CBs do not necessarily include a third CB. A code length corresponding to the third CB is a shortest code length in a plurality of predefined code lengths.

For example, if the plurality of predefined code lengths are {1024, 512, 256, 128, 64}, the M CBs may include a CB whose corresponding code length is 64, or may not include a CB whose corresponding code length is 64.

In a possible implementation, a code length of any one of the M CBs is greater than a shortest code length in a plurality of predefined code lengths.

In a possible implementation, code lengths corresponding to the M CBs are related to a length of the TB. For example, if a data length of the first TB is a first data length, a code length corresponding to any one of the M CBs is greater than a shortest code length in a plurality of predefined code lengths; or if a data length of the first TB is a second data length, the M CBs include at least one third CB, and a code length corresponding to the third CB is a shortest code length in a plurality of predefined code lengths.

In another possible implementation of the second aspect, the method further includes: receiving second indication information, where the second indication information indicates the target segmentation manner in the plurality of segmentation manners.

In another possible implementation of the second aspect, the method further includes: receiving the second indication information by receiving signaling.

In another possible implementation of the second aspect, the second indication information is carried in a header of a frame. The frame is a transmission unit. Optionally, the second indication information may be specifically transmitted by using a field in the frame header.

In another possible implementation of the second aspect, a code length L corresponding to the CB satisfies the following equation:

$$L = 2^n, \text{ where } n \text{ is a natural number.}$$

In another possible implementation of the second aspect, a code length corresponding to the CB is one or more of predefined code lengths, and the predefined code lengths include at least one of 1024, 512, 256, 128, 64, or the like.

According to a third aspect, an embodiment of this application provides a communication method, including:

obtaining first data based on a first TB in a target segmentation manner in a plurality of segmentation manners, where the first data includes M CBs, the plurality of segmentation manners are predefined or preconfigured, and M is a positive integer:

generating at least one codeword based on the M code blocks; and sending the at least one codeword.

In the foregoing implementation, the transmit end supports a plurality of TB segmentation manners. When the transport block is segmented, the transmit end may determine the target segmentation manner from the plurality of segmentation manners, and segment the TB in the target segmentation manner. Because the segmentation manner can be flexibly determined, a segmentation manner applicable to a current scenario can be determined in different transmission scenarios. This improves transmission performance.

Optionally, the method is applicable to any communication node having a communication function, for example, a transmit node.

In a possible implementation of the third aspect, the foregoing method is implemented at an object layer of wireless communication.

In another possible implementation of the third aspect, the target segmentation manner is a first segmentation manner in the plurality of segmentation manners; and the M CBs include at least one third CB, and a code length corresponding to the third CB is a shortest code length in a plurality of predefined code lengths.

In another possible implementation of the third aspect, the target segmentation manner is a second segmentation manner in the plurality of segmentation manners.

The M CBs do not necessarily include a third CB. A code length corresponding to the third CB is a shortest code length in a plurality of predefined code lengths.

For example, if the plurality of predefined code lengths are {1024, 512, 256, 128, 64}, the M CBs may include a CB whose corresponding code length is 64, or may not include a CB whose corresponding code length is 64.

In a possible implementation, a code length of any one of the M CBs is greater than a shortest code length in a plurality of predefined code lengths.

In a possible implementation, code lengths corresponding to the M CBs are related to a length of the TB. For example, if a data length of the first TB is a first data length, a code length corresponding to any one of the M CBs is greater than a shortest code length in a plurality of predefined code lengths; or if a data length of the first TB is a second data length, the M CBs include at least one third CB, and a code length corresponding to the third CB is a shortest code length in a plurality of predefined code lengths.

In another possible implementation of the third aspect, the method further includes: sending second indication information, where the second indication information indicates the target segmentation manner in the plurality of segmentation manners.

Optionally, the second indication information may be sent when a communication connection is established between a transmit node and a receive end, or may be sent after a connection is established, or may be sent when specific information is transmitted.

In another possible implementation of the third aspect, the second indication information is sent by using signaling.

In another possible implementation of the third aspect, the second indication information is carried in a header of a frame. The frame is a transmission unit. Optionally, the second indication information may be specifically transmitted by using a field in the frame header.

In another possible implementation of the third aspect, a code length L corresponding to the CB satisfies the following equation:

$$L=2^n, \text{ where n is a natural number.}$$

In another possible implementation of the third aspect, a code length corresponding to the CB is one or more of predefined code lengths, and the predefined code lengths include at least one of 1024, 512, 256, 128, 64, or the like.

In another possible implementation of the third aspect, there is a correspondence between the target segmentation manner and one or more of the following information: a communication channel type, a communication scenario type, a channel quality indication, or a communication capability of a node. The communication capability of the node (which may also be referred to as a capability of the node) may include one or more of the following aspects: a check code addition manner supported by the node, a check capability of the node, and the like, and include indication information for the aspects.

In another possible implementation of the third aspect, the target segmentation manner is a segmentation manner supported by a receive end. In a design, the receive end may feed back, to the transmit end, a segmentation manner supported by the receive end, and the transmit end determines the target segmentation manner from the segmentation manner supported by the receive end.

In another possible implementation of the third aspect, the correspondence is predefined, preconfigured, or negotiated.

According to a fourth aspect, an embodiment of this application provides a communication method, including:

receiving second data in a target segmentation manner in a plurality of segmentation manners, to obtain at least one codeword, where the plurality of segmentation manners are predefined or preconfigured; and processing the at least one codeword to obtain information about a first TB.

In a possible implementation of the fourth aspect, the receiving second data in a target segmentation manner in a plurality of segmentation manners, to obtain at least one codeword includes:

receiving the second data; and obtaining the at least one codeword based on the second data in the target segmentation manner in the segmentation manners.

In another possible implementation of the fourth aspect, the at least one codeword corresponds to M CBs.

In another possible implementation of the fourth aspect, the information about the first TB includes one or more of the following information: the first TB, a check result of the first TB, subdata corresponding to at least one CB, a check result of at least one CB, subdata corresponding to at least one CBG, or a check result of at least one CBG.

In another possible implementation of the fourth aspect, the foregoing method is implemented at an object layer of wireless communication.

In another possible implementation of the fourth aspect, the M CBs include at least one third CB, and a code length corresponding to the third CB is a shortest code length in a plurality of predefined code lengths.

In another possible implementation of the fourth aspect, a code length corresponding to any one of the M CBs is greater than a shortest code length in a plurality of predefined code lengths.

In another possible implementation of the fourth aspect, the method further includes: receiving second indication information, where the second indication information indicates the target segmentation manner in the plurality of segmentation manners.

Optionally, the second indication information may be received when a communication connection is established between a transmit node and a receive end, or may be received after a connection is established, or may be received when specific information is transmitted.

In another possible implementation of the fourth aspect, the method further includes: receiving the second indication information by receiving signaling.

In another possible implementation of the fourth aspect, the second indication information is carried in a header of a frame. The frame is a transmission unit. Optionally, the second indication information may be specifically transmitted by using a field in the frame header.

In another possible implementation of the fourth aspect, a code length L corresponding to the CB satisfies the following equation:

$$L=2^n, \text{ where n is a natural number.}$$

In another possible implementation of the fourth aspect, a code length corresponding to the CB is one or more of predefined code lengths, and the predefined code lengths include at least one of 1024, 512, 256, 128, 64, or the like.

In another possible implementation of the fourth aspect, there is a correspondence between the target segmentation manner and one or more of the following information: a communication channel type, a communication scenario type, a channel quality indication, or a communication capability of a node.

In another possible implementation of the fourth aspect, the target segmentation manner is a segmentation manner supported by a receive end. In a design, the receive end may feed back, to the transmit end, a segmentation manner supported by the receive end, and the transmit end determines the target segmentation manner from the segmentation manner supported by the receive end.

In another possible implementation of the fourth aspect, the correspondence is predefined, preconfigured, or negotiated.

According to a fifth aspect, an embodiment of this application provides a communication apparatus. The communication apparatus includes a processing unit and a communication unit, and the communication apparatus is configured to implement the method described in any one of the first aspect or the possible implementations of the first aspect.

In a possible implementation of the fifth aspect, the processing unit is configured to:

process a first TB in a target check code addition manner in a plurality of check code addition manners, to obtain first data, where the first data includes M CBs, the plurality of check code addition manners are predefined or preconfigured, and M is a positive integer; and generate at least one codeword based on the M code blocks.

The communication unit is configured to send the at least one codeword.

Optionally, the communication apparatus is a communication node, or the communication apparatus is a component in a communication node.

In a possible implementation of the fifth aspect, the communication unit is further configured to send first indication information, where the first indication information indicates the target check code addition manner in the plurality of check code addition manners.

Optionally, the first indication information may be sent when a communication connection is established between a transmit node and a receive end, or may be sent after a connection is established, or may be sent when specific information is transmitted.

In a possible implementation of the fifth aspect, the first indication information is sent by using signaling.

In a possible implementation of the fifth aspect, the first indication information is carried in a header of a frame. The frame is a transmission unit. The header of the frame is also referred to as a frame header, and may include one or more fields. Specifically, the first indication information may be transmitted by using a field in the frame header.

In a possible implementation of the fifth aspect, there is a correspondence between the target check code addition manner and one or more of the following information: a communication channel type, a communication scenario type, a channel quality indication, a communication capability of a node, a code rate, or a radio frame type.

In a possible implementation of the fifth aspect, the target check code addition manner is a check code addition manner supported by a receive end in the plurality of check code addition manners. In a design, the receive end may feed back, to the transmit end, a check code addition manner supported by the receive end, and the transmit end determines the target check code addition manner from the check code addition manner supported by the receive end.

In a possible implementation of the fifth aspect, the correspondence is predefined, preconfigured, or negotiated.

In a possible implementation of the fifth aspect.

the target check code addition manner is a first check code addition manner in the plurality of check code addition manners:

the first TB and a first cyclic redundancy check CRC jointly correspond to N pieces of subdata, the first CRC is a CRC corresponding to the first TB, and N is a positive integer:

the M CBs include M1 first CBs, each first CB includes one piece of subdata and a second CRC, the second CRC is a CRC corresponding to the one piece of subdata, and M1≥0; and the M CBs include M2 second CBs, the M2 second CBs correspond to N1 pieces of subdata and a third CRC, the third CRC is a CRC jointly corresponding to the N1 pieces of subdata, M2>0), and N1>0.

In a possible implementation of the fifth aspect, a code length corresponding to the first CB is a first code length; and a code length corresponding to the second CB is a second code length, and the first code length is different from the second code length.

In a possible implementation of the fifth aspect, M2+N1=N.

In a possible implementation of the fifth aspect, the M CBs include M3 third CBs, the M3 third CBs correspond to N2 pieces of subdata, the third CB does not include a CRC, M3>0, and N2>0).

In a possible implementation of the fifth aspect, the target check code addition manner is a second check code addition manner in the plurality of check code addition manners; and the first TB and a first CRC jointly correspond to the M CBs, and the first CRC is a CRC corresponding to the first TB.

In a possible implementation of the fifth aspect, the target check code addition manner is a third check code addition manner in the plurality of check code addition manners:

the first TB and a first CRC of the first TB jointly correspond to M pieces of subdata, and the first CRC is a CRC corresponding to the first TB; and each of the M CBs includes one piece of subdata and a second CRC, and the second CRC is a CRC corresponding to the one piece of subdata.

In a possible implementation of the fifth aspect, the processing unit is further configured to:

add the first CRC to the first TB in the target check code addition manner in the plurality of check code addition manners, to obtain a TB with a check code; and segment the TB with the check code in a target segmentation manner in a plurality of segmentation manners, to obtain the M CBs.

In a possible implementation of the fifth aspect, the segmentation operation is implemented at an object layer of wireless communication.

In a possible implementation of the fifth aspect, the target segmentation manner is a first segmentation manner in the plurality of segmentation manners; and the M CBs include at least one third CB, and a code length corresponding to the third CB is a shortest code length in a plurality of predefined code lengths.

In a possible implementation of the fifth aspect, the target segmentation manner is a second segmentation manner in the plurality of segmentation manners.

The M CBs do not necessarily include a third CB. A code length corresponding to the third CB is a shortest code length in a plurality of predefined code lengths.

For example, if the plurality of predefined code lengths are {1024, 512, 256, 128, 64}, the M CBs may include a CB whose corresponding code length is 64, or may not include a CB whose corresponding code length is 64.

In a possible implementation, a code length of any one of the M CBs is greater than a shortest code length in a plurality of predefined code lengths.

In a possible implementation, code lengths corresponding to the M CBs are related to a length of the TB. For example, if a data length of the first TB is a first data length, a code length corresponding to any one of the M CBs is greater than a shortest code length in a plurality of predefined code lengths; or if a data length of the first TB is a second data length, the M CBs include at least one third CB, and a code length corresponding to the third CB is a shortest code length in a plurality of predefined code lengths.

In a possible implementation of the fifth aspect, the communication unit is further configured to: send second indication information, where the second indication information indicates the target segmentation manner in the plurality of segmentation manners.

Optionally, the second indication information may be sent when a communication connection is established between a transmit node and a receive end, or may be sent after a connection is established, or may be sent when specific information is transmitted.

In a possible implementation of the fifth aspect, the second indication information is sent by using signaling.

In a possible implementation of the fifth aspect, the second indication information is carried in a header of a frame. The frame is a transmission unit. Optionally, the second indication information may be specifically transmitted by using a field in the frame header.

In a possible implementation of the fifth aspect, a code length L corresponding to the CB satisfies the following equation:

$$L=2^n, \text{ where } n \text{ is a natural number.}$$

In a possible implementation of the fifth aspect, a code length corresponding to the CB is one or more of predefined code lengths, and the predefined code lengths include at least one of 1024, 512, 256, 128, 64, or the like.

According to a sixth aspect, an embodiment of this application provides a communication apparatus. The communication apparatus includes a processing unit and a communication unit, and the communication apparatus is configured to implement the method described in any one of the first aspect or the possible implementations of the first aspect.

In a possible implementation of the sixth aspect, the communication unit is configured to receive at least one codeword.

The processing unit is configured to process the at least one codeword in a target check code addition manner in a plurality of check code addition manners, to obtain information about a first TB, where the plurality of check code addition manners are predefined or preconfigured.

Optionally, the communication apparatus is a communication node, or the communication apparatus is a component in a communication node.

In another possible implementation of the sixth aspect, the information about the first TB includes one or more of the following information: the first TB, a check result of the first TB, subdata corresponding to at least one CB, a check result of at least one CB, subdata corresponding to at least one CBG, or a check result of at least one CBG.

In another possible implementation of the sixth aspect, the communication unit is further configured to: receive first indication information, where the first indication information indicates the target check code addition manner in the plurality of check code addition manners.

In another possible implementation of the sixth aspect, the communication unit is further configured to receive the first indication information by receiving signaling.

In another possible implementation of the sixth aspect, the first indication information is carried in a header of a frame. The frame is a transmission unit. The header of the frame is also referred to as a frame header, and may include one or more fields. Specifically, the first indication information may be transmitted by using a field in the frame header.

In another possible implementation of the sixth aspect, there is a correspondence between the target check code addition manner and one or more of the following information: a communication channel type, a communication scenario type, a channel quality indication, a communication capability of a node, a code rate, or a radio frame type.

In another possible implementation of the sixth aspect, the correspondence is predefined, preconfigured, or negotiated.

In another possible implementation of the sixth aspect, the target check code addition manner is a check code addition manner supported by a receive end in the plurality of check code addition manners. In a design, the receive end may feed back, to the transmit end, a check code addition manner supported by the receive end, and the transmit end determines the target check code addition manner from the check code addition manner supported by the receive end.

In another possible implementation of the sixth aspect, the processing unit is further configured to:

obtain M CBs based on the at least one codeword, where M is a positive integer; and check the M CBs in the target check code addition manner in the plurality of check code addition manners, to obtain the information about the first TB.

In another possible implementation of the sixth aspect, the first TB and a first cyclic redundancy check CRC jointly correspond to N pieces of subdata, the first CRC is a CRC corresponding to the first TB, and N is a positive integer:

the M CBs include M1 first CBs, each first CB includes one piece of subdata and the first CRC, the first CRC corresponds to the one piece of subdata, and M1≥0); and the M CBs include M2 second CBs, the M2 second CBs correspond to N1 pieces of subdata and a third CRC, the third CRC is a CRC jointly corresponding to the N1 pieces of subdata, M2>0, and N1≥0.

In another possible implementation of the sixth aspect, the processing unit is further configured to:

for the M1 second CBs, check, based on a second CRC included in each first CB, whether subdata corresponding to the first CB is correctly transmitted; and for the M2 second CBs, check, based on the third CRC, whether the N1 pieces of subdata are correctly transmitted.

In another possible implementation of the sixth aspect, the processing unit is further configured to:

when M1 pieces of subdata corresponding to the M1 second CBs are correctly transmitted and the N1 pieces of subdata are correctly transmitted, obtain a first TB with a check code based on the M1 pieces of subdata and the N1 pieces of subdata, where the first TB with the check code includes the first TB and the first CRC; and check the first TB based on the first CRC, to obtain the first TB or the check result of the first TB.

In another possible implementation of the sixth aspect, a code length corresponding to the first CB is a first code length; and a code length corresponding to the second CB is a second code length, and the first code length is different from the second code length.

In another possible implementation of the sixth aspect, M2+N1=N.

In another possible implementation of the sixth aspect, the M CBs include M3 third CBs, the M3 third CBs correspond to N2 pieces of subdata, the third CB does not include a CRC, M3≥0), and N2≥0).

In another possible implementation of the sixth aspect, the first TB and a first CRC jointly correspond to the M CBs, and the first CRC is a CRC corresponding to the first TB.

In another possible implementation of the sixth aspect, the processing unit is further configured to:

obtain a first TB with a check code based on the M CBs, where the first TB with the check code includes the first TB and the first CRC; and check the first TB based on the first CRC, to obtain the first TB or the check result of the first TB.

In another possible implementation of the sixth aspect, the first TB and a first cyclic redundancy check CRC of the first TB jointly correspond to M pieces of subdata; and each CB includes one piece of subdata and a second CRC corresponding to the one piece of subdata.

In another possible implementation of the sixth aspect, the processing unit is further configured to:

for the M CBs, check, based on the second CRC included in each CB, whether the subdata included in each CB is correctly transmitted:

when the M pieces of subdata are correctly transmitted, obtain a first TB with a check code based on the M pieces of subdata, where the first TB with the check code includes the first TB and a first CRC; and check the first TB based on the first CRC, to obtain the first TB or the check result of the first TB.

In another possible implementation of the sixth aspect, the M CBs are obtained in a target segmentation manner in a plurality of segmentation manners.

In another possible implementation of the sixth aspect, the target segmentation manner is a first segmentation manner in the plurality of segmentation manners; and the M CBs include at least one third CB, and a code length corresponding to the third CB is a shortest code length in a plurality of predefined code lengths.

In another possible implementation of the sixth aspect, the target segmentation manner is a second segmentation manner in the plurality of segmentation manners.

The M CBs do not necessarily include a third CB. A code length corresponding to the third CB is a shortest code length in a plurality of predefined code lengths.

For example, if the plurality of predefined code lengths are {1024, 512, 256, 128, 64}, the M CBs may include a CB whose corresponding code length is 64, or may not include a CB whose corresponding code length is 64.

In a possible implementation, a code length of any one of the M CBs is greater than a shortest code length in a plurality of predefined code lengths.

In a possible implementation, code lengths corresponding to the M CBs are related to a length of the TB. For example, if a data length of the first TB is a first data length, a code length corresponding to any one of the M CBs is greater than a shortest code length in a plurality of predefined code lengths; or if a data length of the first TB is a second data length, the M CBs include at least one third CB, and a code length corresponding to the third CB is a shortest code length in a plurality of predefined code lengths.

In another possible implementation of the sixth aspect, the communication unit is further configured to: receive second indication information, where the second indication information indicates the target segmentation manner in the plurality of segmentation manners.

In another possible implementation of the sixth aspect, the communication unit is further configured to receive the second indication information by receiving signaling.

In another possible implementation of the sixth aspect, the second indication information is carried in a header of a frame. The frame is a transmission unit. Optionally, the second indication information may be specifically transmitted by using a field in the frame header.

In another possible implementation of the sixth aspect, a code length L corresponding to the CB satisfies the following equation:

$$L = 2^n, \text{ where } n \text{ is a natural number.}$$

In another possible implementation of the sixth aspect, a code length corresponding to the CB is one or more of predefined code lengths, and the predefined code lengths include at least one of 1024, 512, 256, 128, 64, or the like.

According to a seventh aspect, an embodiment of this application provides a communication apparatus. The communication apparatus includes a processing unit and a communication unit, and the communication apparatus is configured to implement the method described in any one of the first aspect or the possible implementations of the first aspect.

In a possible implementation of the seventh aspect, the processing unit is configured to:

obtain first data based on a first TB in a target segmentation manner in a plurality of segmentation manners, where the first data includes M CBs, the plurality of segmentation manners are predefined or preconfigured, and M is a positive integer; and generate at least one codeword based on the M code blocks.

The communication unit is configured to send the at least one codeword.

Optionally, the communication apparatus is a communication node, or the communication apparatus is a component in a communication node.

In another possible implementation of the seventh aspect, the foregoing method is implemented at an object layer of wireless communication.

In another possible implementation of the seventh aspect, the target segmentation manner is a first segmentation manner in the plurality of segmentation manners; and the M CBs include at least one third CB, and a code length corresponding to the third CB is a shortest code length in a plurality of predefined code lengths.

In another possible implementation of the seventh aspect, the target segmentation manner is a second segmentation manner in the plurality of segmentation manners.

The M CBs do not necessarily include a third CB. A code length corresponding to the third CB is a shortest code length in a plurality of predefined code lengths.

For example, if the plurality of predefined code lengths are {1024, 512, 256, 128, 64}, the M CBs may include a CB whose corresponding code length is 64, or may not include a CB whose corresponding code length is 64.

In a possible implementation, a code length of any one of the M CBs is greater than a shortest code length in a plurality of predefined code lengths.

In a possible implementation, code lengths corresponding to the M CBs are related to a length of the TB. For example, if a data length of the first TB is a first data length, a code length corresponding to any one of the M CBs is greater than a shortest code length in a plurality of predefined code lengths; or if a data length of the first TB is a second data length, the M CBs include at least one third CB, and a code length corresponding to the third CB is a shortest code length in a plurality of predefined code lengths.

In another possible implementation of the seventh aspect, the communication unit is further configured to: send second indication information, where the second indication information indicates the target segmentation manner in the plurality of segmentation manners.

Optionally, the second indication information may be sent when a communication connection is established between a transmit node and a receive end, or may be sent after a connection is established, or may be sent when specific information is transmitted.

In another possible implementation of the seventh aspect, the second indication information is sent by using signaling.

In another possible implementation of the seventh aspect, the second indication information is carried in a header of a frame. The frame is a transmission unit. Optionally, the second indication information may be specifically transmitted by using a field in the frame header.

In another possible implementation of the seventh aspect, a code length L corresponding to the CB satisfies the following equation:

$$L=2^n, \text{where } n \text{ is a natural number.}$$

In another possible implementation of the seventh aspect, a code length corresponding to the CB is one or more of predefined code lengths, and the predefined code lengths include at least one of 1024, 512, 256, 128, 64, or the like.

In another possible implementation of the seventh aspect, there is a correspondence between the target segmentation manner and one or more of the following information: a communication channel type, a communication scenario type, a channel quality indication, or a communication capability of a node.

In another possible implementation of the seventh aspect, the target segmentation manner is a segmentation manner supported by a receive end. In a design, the receive end may feed back, to the transmit end, a segmentation manner supported by the receive end, and the transmit end determines the target segmentation manner from the segmentation manner supported by the receive end.

In another possible implementation of the seventh aspect, the correspondence is predefined, preconfigured, or negotiated.

According to an eighth aspect, an embodiment of this application provides a communication apparatus. The communication apparatus includes a processing unit and a communication unit, and the communication apparatus is configured to implement the method described in any one of the first aspect or the possible implementations of the first aspect.

In a possible implementation of the eighth aspect, the communication unit is configured to receive the second data in a target segmentation manner in a plurality of segmentation manners, to obtain at least one codeword, where the plurality of segmentation manners are predefined or preconfigured.

The processing unit is configured to process the at least one codeword to obtain information about a first TB.

In a possible implementation of the eighth aspect, the communication unit is further configured to receive the second data.

The processing unit is further configured to obtain the at least one codeword based on the second data in the target segmentation manner in the segmentation manners.

In another possible implementation of the eighth aspect, the at least one codeword corresponds to M CBs.

In another possible implementation of the eighth aspect, the foregoing method is implemented at an object layer of wireless communication.

In another possible implementation of the eighth aspect, the M CBs include at least one third CB, and a code length corresponding to the third CB is a shortest code length in a plurality of predefined code lengths.

In another possible implementation of the eighth aspect, a code length corresponding to any one of the M CBs is greater than a shortest code length in a plurality of predefined code lengths.

In another possible implementation of the eighth aspect, the communication unit is further configured to: receive second indication information, where the second indication information indicates the target segmentation manner in the plurality of segmentation manners.

Optionally, the second indication information may be received when a communication connection is established between a transmit node and a receive end, or may be received after a connection is established, or may be received when specific information is transmitted.

In another possible implementation of the eighth aspect, the communication unit is further configured to receive the second indication information by receiving signaling.

In another possible implementation of the eighth aspect, the second indication information is carried in a header of a frame. The frame is a transmission unit. Optionally, the second indication information may be specifically transmitted by using a field in the frame header.

In another possible implementation of the eighth aspect, a code length L corresponding to the CB satisfies the following equation:

$$L=2^n, \text{where } n \text{ is a natural number.}$$

In another possible implementation of the eighth aspect, a code length corresponding to the CB is one or more of predefined code lengths, and the predefined code lengths include at least one of 1024, 512, 256, 128, 64, or the like.

In another possible implementation of the eighth aspect, there is a correspondence between the target segmentation manner and one or more of the following information: a communication channel type, a communication scenario type, a channel quality indication, or a communication capability of a node.

In another possible implementation of the eighth aspect, the target segmentation manner is a segmentation manner supported by a receive end. In a design, the receive end may feed back, to the transmit end, a segmentation manner supported by the receive end, and the transmit end determines the target segmentation manner from the segmentation manner supported by the receive end.

In another possible implementation of the eighth aspect, the correspondence is predefined, preconfigured, or negotiated.

According to a ninth aspect, an embodiment of this application provides a communication apparatus. The communication apparatus includes a processor and a communication interface. The communication interface is configured to receive and/or send data, and/or the communication interface is configured to provide an input and/or an output for the processor. The communication apparatus is configured to implement the method described in any one of the possible implementations of the first to fourth aspects.

It should be noted that the processor included in the communication apparatus described in the ninth aspect may be a processor (referred to as a dedicated processor for ease of differentiation) specially configured to perform the methods, or may be a processor that performs the methods by invoking a computer program, for example, a general-purpose processor. Optionally, the at least one processor may further include both a dedicated processor and a general-purpose processor.

Optionally, the computer program may be stored in a memory. For example, the memory may be a non-transitory memory, for example, a read-only memory (ROM).

The memory and the processor may be integrated into a same component, or may be separately disposed on different components. A type of the memory and a manner of disposing the memory and the processor are not limited in embodiments of this application.

In a possible implementation, the at least one memory is located outside the communication apparatus.

In another possible implementation, the at least one memory is located in the communication apparatus.

In another possible implementation, some memories in the at least one memory are located in the communication apparatus, and the other memories are located outside the communication apparatus.

According to a tenth aspect, an embodiment of this application provides a communication system. The communication system includes a first node and a second node, the first node is configured to implement the method according to any one of the implementations of the first aspect, and the second node is configured to implement the method according to any one of the implementations of the second aspect.

According to an eleventh aspect, an embodiment of this application provides a communication system. The communication system includes a first node and a second node, the first node is configured to implement the method according to any one of the implementations of the third aspect, and the second node is configured to implement the method according to any one of the implementations of the fourth aspect.

According to a twelfth aspect, this application provides a chip. The chip may include a processor and an interface. The processor is configured to read instructions by using the interface, to perform the method according to any one of the first to fourth aspects.

According to a thirteenth aspect, this application provides a terminal. The terminal is configured to implement the method according to any one of the first to fourth aspects.

Alternatively, the terminal may include the communication apparatus according to any one of the fifth to ninth aspects.

Examples of some terminals include but are not limited to: a smart home device (such as a television, a floor sweeping robot, a smart desk lamp, a sound system, a smart lighting system, an electrical control system, home background music, a home theater system, an intercom system, and a video surveillance), a smart transportation device (such as a car, a ship, a drone, a train, and a truck), a smart manufacturing device (such as a robot, an industrial device, smart logistics, and a smart factory), and a smart terminal (a mobile phone, a computer, a tablet computer, a palmtop computer, a desktop computer, a headset, a sound box, a wearable device, an in-vehicle device, a virtual reality device, an augmented reality device, and the like).

According to a fourteenth aspect, an embodiment of this application provides a computer-readable storage medium. The computer-readable storage medium stores instructions. When the instructions are run on at least one processor, the method described in any one of the first and second aspects is implemented.

According to a fifteenth aspect, this application provides a computer program product. The computer program product includes computer instructions. When the instructions are run on at least one processor, the method described in any one of the first and second aspects is implemented.

For beneficial effects of some implementations of the technical solutions provided in the second to fifteenth aspects of this application, refer to beneficial effects of the technical solution in the first aspect. Details are not described herein again.

BRIEF DESCRIPTION OF DRAWINGS

The following briefly describes accompanying drawings used in descriptions of embodiments.

FIG. 2 is a schematic diagram of a wireless communication system according to an embodiment of this application:

FIG. 3 is a schematic flowchart of a communication method according to an embodiment of this application:

FIG. 4 to FIG. 7 are schematic diagrams of some check code addition manners according to an embodiment of this application:

FIG. 14 is a schematic flowchart of a communication method according to an embodiment of this application:

FIG. 15 is a schematic diagram of a structure of a communication apparatus according to an embodiment of this application.

DESCRIPTION OF EMBODIMENTS

Figure 1:
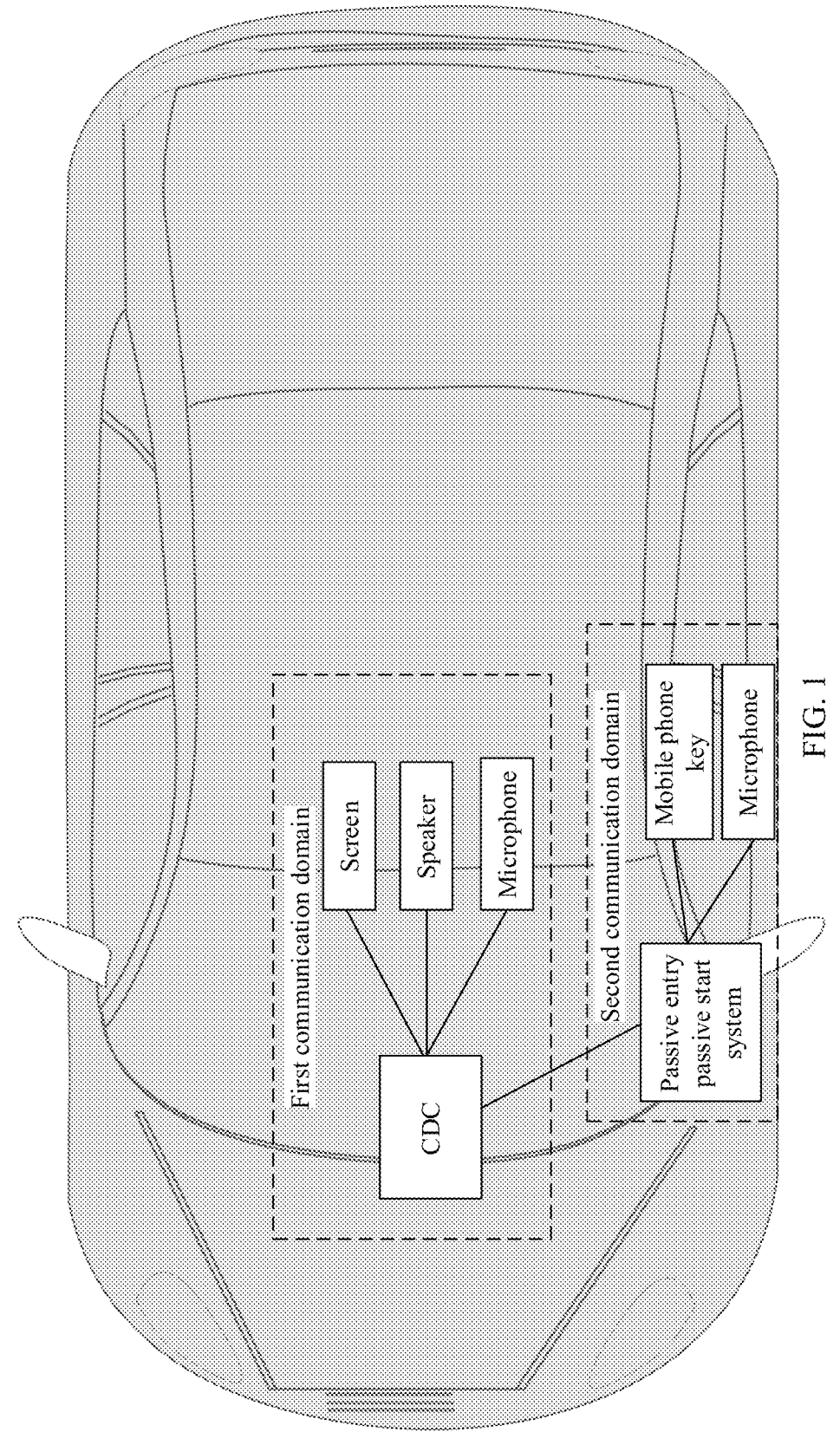
FIG. 1 is a schematic diagram of an application scenario according to an embodiment of this application.

The following describes embodiments of this application in detail with reference to the accompanying drawings. Unless otherwise specified, all technical and scientific terms used in this specification have meanings that are the same as those commonly understood by a person skilled in the art of this application. In case of any inconsistency, the meaning described in this specification or the meaning obtained based on the content recorded in this specification shall be used. In addition, the terms used in this specification are merely for the purpose of describing embodiments of this application, but are not intended to limit this application.

For ease of understanding, some concepts related to embodiments of this application are described for reference by using examples below. Details are as follows:

1. Cyclic Redundancy Check (CRC)

CRC is a channel coding technology that generates a short check code with a fixed quantity of bits based on data such as a network data packet or a computer file, and is mainly used to detect or check an error that may occur during data transmission or after storage.

2. Transmission Unit

In embodiments of this application, the transmission unit is a data unit transmitted between peer layers in a communication process.

For example, the transmission unit may be a protocol data unit (PDU). In a protocol stack of a communication system, an entity at each layer may establish a PDU of the entity at the layer. The PDU includes information from an upper-layer entity and additional information of the entity at the current layer, and then is transmitted to a next layer. In some scenarios, information about an entity at a current layer may not be added, for example, transparent transmission is performed.

In a possible solution, a frame is a transmission unit, and may include data, a header, a trailer, or the like transmitted from an upper layer. For example, the data transmitted from the upper layer is a data packet. After the data packet reaches a current layer, a frame is formed by adding a protocol header and a protocol trailer of the current layer. That is, a front part of the frame includes a header, an end of the frame includes a trailer, and the data packet is used as a data part of the frame. In this way, a complete frame is formed.

Optionally, due to different communication scenarios, frame lengths, or the like, or a protocol specification, the frame may have a plurality of types or formats.

For example, a control-type transmission unit may also be referred to as a control frame or a management frame, and a data-type transmission unit may also be referred to as a data frame.

For example, in a possible solution, according to a protocol specification, a frame may have a long-frame format and a short-frame format.

3. Transport Block (Transmission Block, TB)

The transport block is data transferred from an upper layer (an upper layer of a physical layer). The upper layer herein may be at least one of a media access layer, a link control layer, a data link layer, a network layer, a transport layer, and an application layer. In some scenarios, the transport block is also referred to as service data or raw data. Optionally, the transport block may be in a packet form, and is also referred to as a data packet in some scenarios.

4. Subdata

The subdata is a part of data in a TB (or a TB with check).

5. Code Block (Coded Block, CB)

The code block is a data unit or a sub-packet to be encoded.

In addition, in embodiments of this application, a data length of the CB is a length of data input to an encoder, and the length may include a length of an additional CRC or may not include a length of a CRC. A code length refers to a quantity of bits of a codeword obtained by encoding the code block. For example, if a data length corresponding to a code block is 512 bits, and a corresponding code length is 1024 bits, it means that the code block includes 512-bit data before encoding, and a 1024-bit codeword is obtained after encoding.

6. Polar Code

The polar code is a coding scheme that is theoretically proved to be capable of achieving a Shannon capacity, and has features such as high performance and low encoding/decoding complexity.

In the polar code, a code length corresponding to a codeword output after encoding is a positive integer power of 2. If the code length corresponding to the codeword output after encoding is inconsistent with a length of a quantity of bits that can be transmitted at a physical layer, a rate matching module needs to be additionally configured, so that channel retransmission or puncturing is performed on the encoded codeword by using the rate matching module, to match an actual transmission capability of a channel.

7. Cockpit Domain Controller (CDC)

Domain-based domain controller integration becomes a mainstream architecture of a vehicle control system. In the architecture, the vehicle control system may be divided into a plurality of communication domains, such as a power transmission domain, a vehicle body electronic domain, an assisted driving domain, and a cockpit domain. Each domain is led by a corresponding domain controller.

The CDC, also referred to as a head unit, is a domain controller in a vehicle cockpit domain.

8. Node

The node is an electronic device having a communication capability, and is also referred to as a communication node. For example, the node may include an independent device such as a handheld terminal, a vehicle, an in-vehicle device, a network side device, user equipment, an access terminal, a subscriber unit, a subscriber station, a mobile station, a remote station, a remote terminal, a wireless communication device, a user agent, or a user apparatus, or may be a part (for example, a chip or an integrated circuit) included in the independent device. The node may be any possible smart terminal device (for example, a mobile phone), smart transportation device (for example, a vehicle or a drone), smart manufacturing device, smart home device (for example, a large screen or a sound box), or the like. In a possible scenario, in a vehicle, the node may alternatively be a battery management system and a battery in a battery pack.

For example, when the node is an in-vehicle device, the node may be a vehicle cockpit domain device, or a module in a vehicle cockpit domain device, for example, one or more of modules such as a cockpit domain controller (CDC), a camera, a screen, a microphone, a sound box, an electronic key, and a passive entry passive start system controller.

The node in embodiments of this application may be used in a plurality of application scenarios, for example, the following application scenarios: mobile internet (M1), industrial control, self-driving, transportation safety, internet of things (IOT), a smart city, or a smart home.

The node in this application may be used in a plurality of communication systems, for example, used in the following communication systems: a global system for mobile communications (GSM), a code division multiple access (CDMA) system, a wideband code division multiple access (WCDMA) system, a general packet radio service (GPRS) system, a long term evolution (LTE) system, an LTE frequency division duplex (FDD) system, an LTE time division duplex (TDD) system, a universal mobile telecommunications system (UMTS), a worldwide interoperability for microwave access (WiMAX) communication system, a millimeter-wave communication system such as a 5th generation (5G) system or new radio (NR), a 6th generation (6G) system, various existing short-range communication systems (for example, an in-vehicle wireless communication system), a future evolved short-range communication system, a universal short-range communication system, or the like.

In some application scenarios or some network types, a name of a device having a similar communication capability may not be referred to as a node. However, for ease of description, electronic devices having a communication capability are collectively referred to as nodes in embodiments of this application.

The foregoing example descriptions of the concepts may be applied in the following embodiments.

The following describes an application scenario and a system architecture in embodiments of this application.

A communication system usually includes a plurality of nodes, and the nodes may communicate with each other to transmit data. Using an in-vehicle communication system as an example, there may be a plurality of communication domains in a vehicle. The communication domain is a system including a group of nodes having a communication relationship and a communication connection relationship (that is, a communication link) between the nodes, and is usually used to complete a specific function. For example, one communication domain may include one master node and one or more slave nodes, and the master and slave nodes, or the master nodes, or the slave nodes may communicate with each other. The master node may manage the slave node, has a function of allocating a resource, and is responsible for allocating a resource to the slave node. The slave node follows scheduling of the master node, and communicates with the master node and/or another node by using the resource allocated by the master node.

For example, FIG. 1 is a schematic diagram of a possible application scenario. A CDC, a screen, a speaker, a microphone, or the like may form a communication domain (a first communication domain shown in FIG. 1), and a passive entry passive start (PEPS) system, a mobile phone key, and a vehicle key may form a communication domain (a second communication domain shown in FIG. 1). Using the first communication domain as an example, the CDC may be a master node, and the remaining nodes are slave nodes. For example, the CDC may establish a communication connection to the screen, the speaker, and/or the microphone through wired communication or wireless communication.

In some specific implementation scenarios, the master node may also be referred to as a G node, a management node, or a control node, and the slave node may also be referred to as a T node or a terminal. A communication link from the G node to the T node may be referred to as a C link or a downlink, and a communication link from the T node to the G node may be referred to as a T link or an uplink.

A person skilled in the art should understand that the application scenario shown in FIG. 1 is merely an example scenario to which the solutions of this application are applicable. The types and quantity of nodes in the communication domain are only examples. In addition to the application scenario shown in FIG. 1, the solutions of this application are further applicable to any other suitable application scenario, for example, but not limited to scenarios such as home, office, exhibition hall, and production.

For example, communication nodes include a first node and a second node. FIG. 2 is a schematic diagram of a possible wireless communication system according to an embodiment of this application. A first node 201 sends data to a second node 202. Therefore, the first node 201 is referred to as a transmit end, and the second node 202 is referred to as a receive end.

It should be understood that the communication system may further include more nodes. For ease of description, the nodes are shown as the first node and the second node herein.

To ensure transmission reliability, the transmit end needs to add a check code, for example, a CRC, to the data, and the receive end may determine, by using the check code, whether the data sent by the transmit end is accurately received.

The transmit end may divide the transmitted data into CBs, and each CB includes a CRC. The receive end may determine whether each CB is correctly received, so that the transmit end may resend an incorrect CB. However, in this manner in which each CB includes a CRC, a proportion of the CRC in transmitted bits increases, a transmission code rate is reduced, and transmission performance is affected. Especially, for some applications that do not require high reliability, or for some channels that do not require high reliability, adding a CRC to each CB does not bring more benefits in terms of reliability, but reduces data transmission efficiency, increases a delay, and affects transmission performance.

In addition, some channels, such as a broadcast channel, perform unidirectional broadcast, and a receive end does not need to feed back a receiving status of a transport block or a CB. In this case, adding a CRC to each CB reduces transmission performance.

In view of this, the technical solutions in embodiments of this application are provided.

The following describes in detail a method in embodiments of this application.

Embodiment 1

Refer to FIG. 3. FIG. 3 is a schematic flowchart of a communication method according to an embodiment of this application. Optionally, the method may be applied to the communication system in FIG. 2. The communication method shown in FIG. 3 includes at least step S301 to step S304, which are specifically as follows:

S301: A first node processes a first TB in a target check code addition manner in a plurality of check code addition manners, to obtain first data. The first data includes M CBS, and M is a positive integer.

The first TB is to-be-transmitted data. Processing the first TB may include adding a check code to the first TB, segmenting the first TB, adding a check code to some data (referred to as subdata for ease of description) of the first TB, or the like. The check code may be used to verify whether corresponding data is correctly transmitted.

The check code addition manner indicates a rule for adding a check code, and different check code addition manners correspond to different rules for adding a check code. In this embodiment of this application, a check code addition manner used when a check code is added is one of the plurality of check code addition manners. The plurality of check code addition manners may be predefined or preconfigured. For example, the plurality of check code addition manners are defined by using a protocol. For another example, when the first node is delivered from a factory, the plurality of check code addition manners are written into a memory of the first node. For another example, the plurality of check code addition manners are configured for the first node by using a management interface.

For example, the following enumerates four possible check code addition manners by using an example in which a check code is a CRC.

Check code addition manner 1: The first TB and a first CRC jointly correspond to N pieces of subdata, each CB includes one piece of subdata and a second CRC, and the second CRC is a CRC corresponding to the one piece of subdata. In this case. M=N.

For example, refer to FIG. 4. FIG. 4 is a schematic diagram of a check code addition manner according to an embodiment of this application. The first node may obtain, through calculation based on the entire first TB, the first CRC corresponding to the first TB. The first CRC is, for example, a "TB-CRC" part shown in FIG. 4. The first CRC may be added after the first TB, to obtain a first TB with a check code, as shown in an area 401. The first TB with the check code may be divided into N pieces of subdata, for example, subdata 1 to subdata N shown in FIG. 4. The first node may obtain one second CRC through calculation based on each piece of subdata, for example, a "CB-CRC" part shown in FIG. 4. The second CRC is added after the subdata to obtain a CB.

For example, a CB (1) includes the subdata 1 and a CRC corresponding to the subdata 1, a CB (2) includes the subdata 2 and a CRC corresponding to the subdata 2, and other CBs are deduced by analogy.

Check code addition manner 2: The first TB and a first CRC jointly correspond to N pieces of subdata. In the N pieces of subdata, some subdata separately corresponds to a CRC, and some subdata (jointly) corresponds to a third CRC.

Specifically, the M CBs include M1 (M1>0) first CBs, and each first CB includes one piece of subdata and one second CRC. The second CRC is a CRC corresponding to the one piece of subdata. The M CBs include M2 (M2>0) second CBs, the M2 second CBs correspond to N1 (N1>0) pieces of subdata and the third CRC, and the third CRC is a CRC jointly corresponding to the N1 pieces of subdata.

Figure 5:
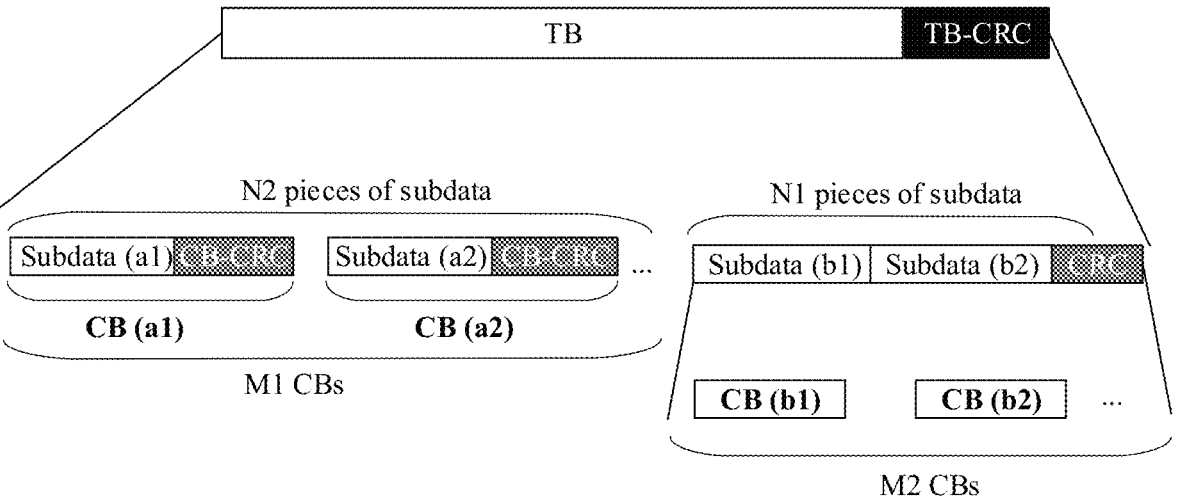

For example, refer to FIG. 5. FIG. 5 is a schematic diagram of a check code addition manner according to an embodiment of this application. For related descriptions of the N pieces of subdata, refer to FIG. 4. In the N pieces of subdata, some subdata (for example, N2 pieces of subdata) corresponds to a separate CRC, so that the M1 (M1=N2) first CBs are formed. As shown in FIG. 5, a first CB includes subdata and a CRC corresponding to the subdata. For example, a CB (a1) includes subdata (a1) and a CRC corresponding to the subdata 1, a CB (a2) includes subdata (a2) and a CRC corresponding to the subdata (a2), and other first CBs are deduced by analogy.

A CRC corresponding to some subdata (for example, N1 pieces of subdata) is added after (or before or in the middle of) the part of subdata. An addition location is not limited in this application. The partial (N1 pieces of) subdata with check may be further divided into one or more second CBs, where the second CBs are, for example, a CB (b1) and a CB (b2). It should be noted that, in FIG. 5. N1 pieces of subdata are used as an example for description. In a specific processing process. N1 may be 0 or may be 1, or may be another positive integer.

In a possible case, a code length corresponding to the first CB is a first code length, the second CB belongs to a second code length, and the first code length is different from the second code length. In other words, for CBs with some code lengths, each CB includes a CRC, and the CBs with some code lengths correspond to subdata with a CRC.

Optionally, the first code length may be one code length, for example, a code length of 1024 or a code length of 512, or may be a code length set including a plurality of code lengths. For example, the second code length may be {256, 128, 64}. Similarly, the second code length may be one code length, for example, a code length of 1024 or a code length of 512, or may be a code length set including a plurality of code lengths.

In a possible design. N2+N1=N.

Figure 6:
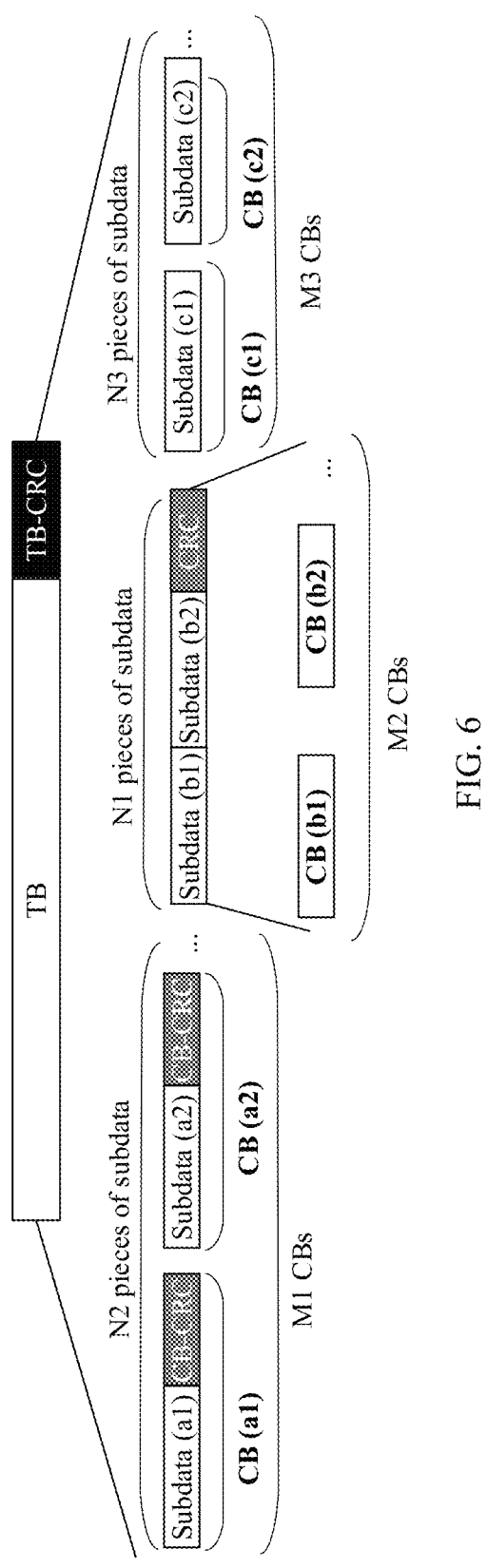

In another possible design, the M CBs further include M3 fourth CBs, the M3 fourth CBs correspond to M3 pieces of subdata, and the M3 third CBs do not include a corresponding CRC. For example. FIG. 6 is a schematic diagram of another check code addition manner according to an embodiment of this application. For N3 pieces of subdata in the N pieces of subdata, the subdata directly forms the third CB, and no check code needs to be added.

Optionally, a code length corresponding to the third CB is a third code length. The third code length may be one code length, for example, a code length of 1024 or a code length of 512, or may be a code length set obtained by using a plurality of code lengths.

Figure 7:
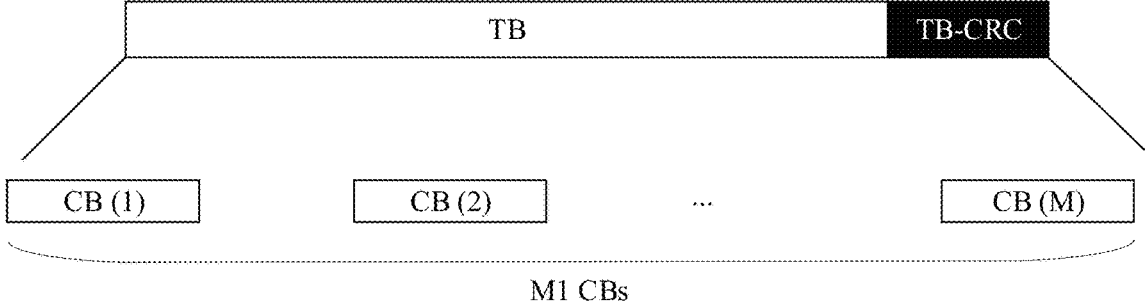

Check code addition manner 3: The first TB and a first CRC jointly correspond to the M CBs. FIG. 7 is a schematic diagram of another check code addition manner according to an embodiment of this application. A first TB to which a check code is added may be divided into M CBs, and each CB does not include a separate check code.

Check code addition manner 4: The first TB corresponds to N pieces of subdata, and a CRC is added to each of the N pieces of subdata, to form the M CBs. Specifically, the first node may divide the TB into N pieces of subdata, and add one CRC to each piece of subdata to form one CB. In this case, N=M.

It should be understood that the foregoing four check code addition manners are possible cases listed in this embodiment of this application. In a specific implementation process, the plurality of check code addition manners may include more or fewer check code addition manners. For example, the plurality of check code addition manners include the check code addition manner 2 and the check code addition manner 3. Alternatively, the plurality of check code addition manners may further include another CRC addition manner that is not listed in this application.

The foregoing describes the check code addition manner, and the following describes a TB segmentation manner. To further reduce power consumption and improve performance, a code length of an encoded CB needs to meet a form of an integer power of 2. That is, a code length of the CB satisfies the following equation:

$$L=2^n, \text{ where } n \text{ is a natural number.}$$

In a possible design, the code length of the CB is one or more of a plurality of predefined code lengths. For example, the plurality of predefined code lengths include one or more of the following code lengths: 1024, 512, 256, 128, or 64.

It should be noted that, in the M CBs, different CBs may be corresponding to a same code length or different code lengths. A code length corresponding to a CB and a quantity of CBs with each code length may be determined in a segmentation manner. In this embodiment of this application, when the TB is segmented, a used target segmentation manner may be one of a plurality of segmentation manners. Optionally, the plurality of segmentation manners may be preconfigured or predefined. For example, the plurality of check code addition manners are defined by using a protocol. Alternatively, when a node is delivered from a factory, the plurality of check code addition manners are written into the node. Alternatively, the plurality of check code addition manners are configured in a node by using a communication interface.

For ease of understanding, the following lists several possible segmentation manners.

Segmentation manner 1: The M CBs include at least one third CB, and a code length corresponding to the third CB is a shortest code length in a plurality of predefined code lengths.

Figure 8:
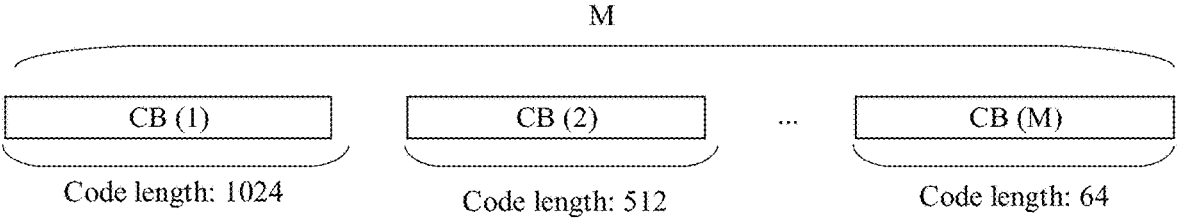
FIG. 8 is a schematic diagram of a segmentation manner according to an embodiment of this application.

For example, if the plurality of predefined code lengths (or a predefined code length set) include five code lengths: 1024, 512, 256, 128, and 64, the M CBs include at least one CB whose code length is 64. FIG. 8 is a schematic diagram of a possible segmentation manner according to an embodiment of this application. In the M CBs, a code length corresponding to a CB (M) is 64.

Segmentation manner 2: In the M CBs, a code length of the CB belongs to a plurality of consecutive code lengths in a plurality of predefined code lengths. For example, the predefined code lengths include five code lengths: 1024, 512, 256, 128, and 64. In this case, in the M CBs, code lengths of the CBs include three code lengths (referred to as L1, L2, and L3 for ease of description), and the three code lengths are consecutive code lengths in the five code lengths. That is, (L1, L2, L3) may be (1024, 512, 256), (512, 256, 128), or (256, 128, 64). Optionally, locations of CBs with L1, L2, and L3 are merely examples.

In a design, after CBs with different code lengths are encoded to form codewords, when the codewords form a sequence, code lengths corresponding to the CBs are in a descending trend.

Figure 9:
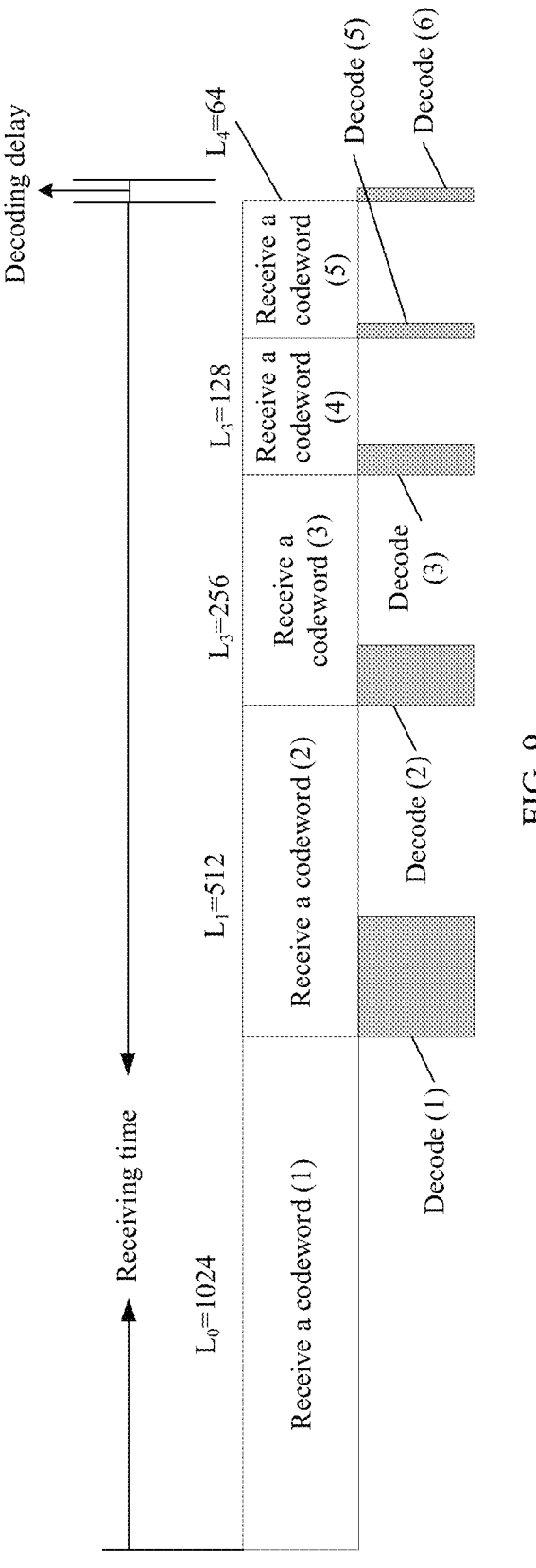
FIG. 9 is a schematic diagram of a decoding delay according to an embodiment of this application.

For example, if the code lengths of the CBs are 1024, 512, 256, 128, and 64, quantities of CBs corresponding to the code lengths are 1, 1, 1, 1, and 1 respectively. After a CB is encoded, when a sequence is formed in a bearer part of a transmission unit, a codeword corresponding to a CB with a code length of 1024 is in the front of the sequence, and codewords are respectively codewords corresponding to CBs with code lengths of 1024, 512, 256, 128, and 64 from front to back. FIG. 9 is a schematic diagram of a possible decoding delay, and is a schematic diagram of receiving and decoding time of sequences of CBs with different code lengths. A receive end first receives a codeword (1) with a code length of 1024. When decoding the codeword (1), the receive end may receive a codeword (2). When decoding the codeword (2), the receive end may receive a codeword (3) . . . , so that a former codeword may be decoded within time of receiving a latter codeword. This implements pipeline decoding, improves decoding efficiency, and reduces a delay.

Segmentation manner 3: The M CBs do not necessarily include a third CB. A code length corresponding to the third CB is a shortest code length in a plurality of predefined code lengths.

For example, the plurality of predefined code lengths are {1024, 512, 256, 128, 64}. The M CBs may include a CB whose corresponding code length is 64, or may not include a CB whose corresponding code length is 64.

In a possible implementation, a code length of any one of the M CBs is greater than a shortest code length in a plurality of predefined code lengths.

In a possible implementation, code lengths corresponding to the M CBs are related to a length of the TB. For example, if a data length of the first TB is a first data length, a code length corresponding to any one of the M CBs is greater than a shortest code length in a plurality of predefined code lengths; or if a data length of the first TB is a second data length, the M CBs include at least one third CB, and a code length corresponding to the third CB is a shortest code length in a plurality of predefined code lengths. The first data length may include at least one piece of data, or may include a plurality of data lengths, or may be one or more data length ranges. Similarly, the second data length may include at least one piece of data, or may include a plurality of data lengths, or may be one or more data length ranges.

For a TB with a same length. CBs are obtained through segmentation in the manner 4. Because the CB may not include a block with a shortest code length, fewer CBs may be obtained. This reduces time consumption during check code calculation, increases a code rate, and improves data transmission efficiency. In addition, a longer codeword corresponding to a code block indicates a stronger error correction capability of a transmission system. Therefore, increasing a code length corresponding to a CB can improve an error correction capability.

Segmentation manner 4: In the M CBs, code lengths of the CBs may be inconsecutive. For example, the predefined code lengths include five code lengths: 1024, 512, 256, 128, and 64. In this case, in the M CBs, code lengths of the CBs include three code lengths (referred to as L1, L2, and L3 for ease of description), and the three code lengths may be inconsecutive. That is, (L1, L2, L3) may be (1024, 512, 128), (1024, 512, 64), (512, 256, 64), or the like. Locations of L1, L2, and L3 are only examples.

The foregoing four segmentation manners are merely examples, and more or fewer segmentation manners may be included in a specific implementation process. For example, the plurality of segmentation manners may include the segmentation manner 1, the segmentation manner 2, and the segmentation manner 3. When the first node processes the first TB, a process of segmenting the first TB based on one of the foregoing three segmentation manners is included. It should be understood that the foregoing four segmentation manners may be combined in a case in which the four segmentation manners are not mutually exclusive. For example, the segmentation manner 1 and the segmentation manner 2 may be combined. For example, a segmentation manner 5 is obtained through combination. Segmentation manner 5: The M CBs include at least one CB whose code length is a shortest code length, and code lengths of the CBs are a plurality of consecutive code lengths in a plurality of predefined code lengths.

In a design, the code length L of the CB is related to one or more of the following parameters: a data length of the CB, a preset first code rate, an order reduction threshold, redundancy information, and the like. The first code rate may be a code rate required by a transmission format, or may be a code rate manually selected according to a requirement, or may be a code rate selected from a plurality of predefined or preconfigured code rates according to a rule. The rule may be, for example, polling selection or random selection. This is not specifically limited. The code rate can be adjusted based on the order reduction threshold.

In a possible implementation, a correspondence between S code lengths, T code rates, and S×T data lengths is predefined or preconfigured on the first node, and each data length in the S×T data lengths may correspond to one of the S code lengths and one of the T code rates, and is used to represent a preset or preconfigured data length of a code block when a code block with a corresponding code length is transmitted at the corresponding code rate. Both S and T are positive integers. Optionally, the correspondence between the S code lengths, the T code rates, and the S×T data lengths may be represented by one or more of a table, a stack, a database, a queue, or another form. For example, when the correspondence is represented in a form of a table, Table 1 shows an example of a table of the correspondence between the S code lengths, the T code rates, and the S×T data lengths (data lengths of CBs) set or configured according to a correspondence 1. The correspondence table is also referred to as a segment length reference table, or is referred to as a K table for short. In "512×(¼-⅛)", ⅛ is the order reduction threshold, which can be used to adjust the code rate.

TABLE 1

| Specific example of a K table | | | | |
|---|---|---|---|---|
| Code | Code length (bit) | | | |
| rate | 1024 | 512 | 256 | 128 | 64 |

| Code rate | 1024 | 512 | 256 | 128 | 64 |
|---|---|---|---|---|---|
| 1/4 | 1024 × 1/4 | 512 × (1/4-1/8) | 256 × (1/4-1/8) | 128 × (1/4-1/8) | 64 × (1/4-1/8) |
| 3/8 | 1024 × 3/8 | 512 × 1/4 | 256 × 1/4 | 128 × 1/4 | 64 × 1/4 |
| 1/2 | 1024 × 1/2 | 512 × 3/8 | 256 × 3/8 | 128 × 3/8 | 64 × 3/8 |
| 5/8 | 1024 × 5/8 | 512 × 1/2 | 256 × 1/2 | 128 × 1/2 | 64 × 1/2 |
| 3/4 | 1024 × 3/4 | 512 × 5/8 | 256 × 5/8 | 128 × 5/8 | 64 × 5/8 |
| 7/8 | 1024 × 7/8 | 512 × 3/4 | 256 × 3/4 | 128 × 3/4 | 64 × 3/4 |

For example, the first node may process the TB in the target segmentation manner 5 and the check code addition manner 2 to form the M CBs. The M CBs include a CB with a shortest code length, and code lengths of the M CBs are in a descending trend. For example, Table 1 is a used K table, a preset first code rate is ½, a length of the first TB is 750 bits, a data length of a CRC is 20 bits (only an example), and predefined code lengths are 1024, 512, 256, 128, and 64. The first node adds a first CRC to the first TB, to obtain a TB (770 bits) with a check code.

Figure 10:
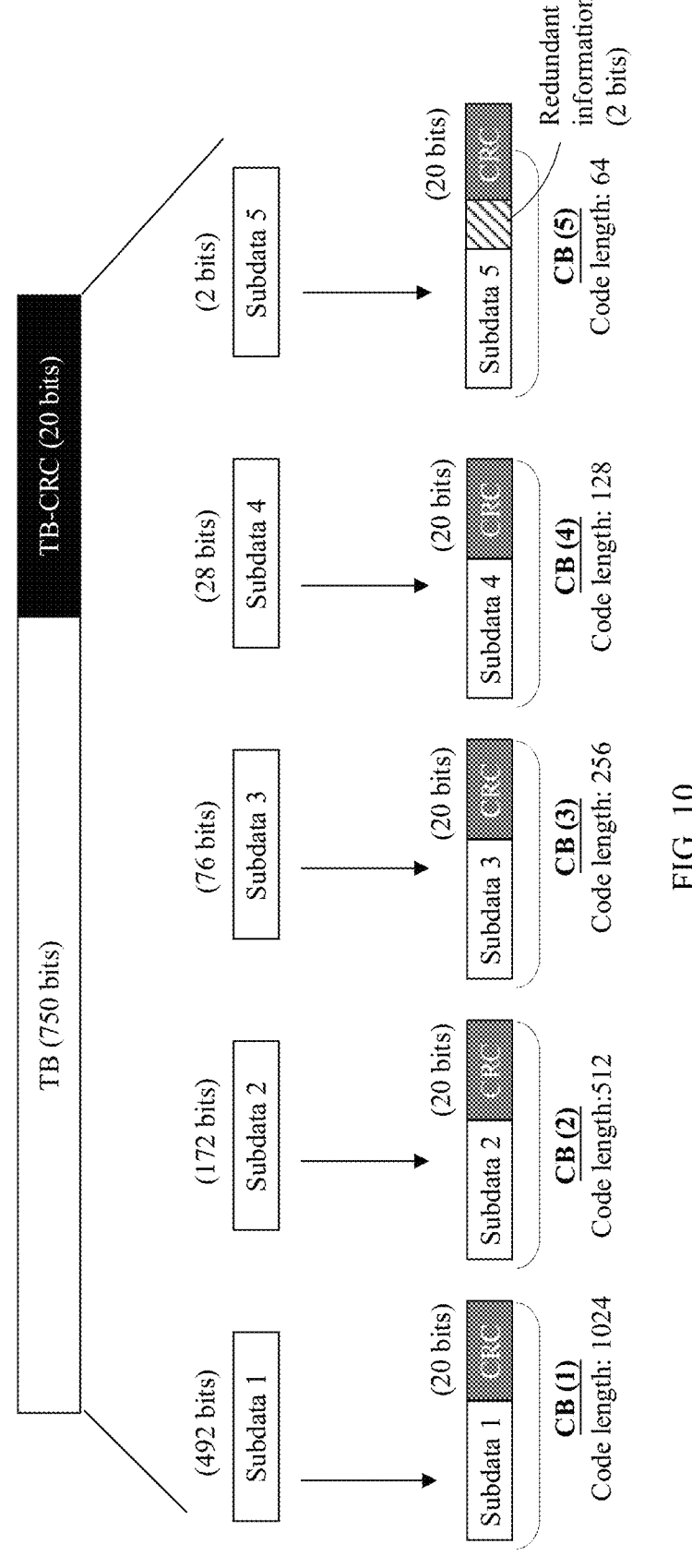
FIG. 10 is a schematic diagram of another segmentation manner according to an embodiment of this application.

FIG. 10 is a schematic diagram of a possible segmentation manner according to this application. The TB with the check code is segmented in the segmentation manner to obtain five pieces of subdata, and the five pieces of subdata may form five CBs. As shown in FIG. 10, quantities of CBs whose code lengths are 1024, 512, 256, 128, and 64 are respectively 1, 1, 1, 1, and 1. In this way, the five CBs include a CB whose code length is 64, and the code lengths corresponding to the CBs are in a continuous ascending trend.

A CB (1) includes subdata 1 and a CRC corresponding to the subdata 1, a size of the CB 1 is 512 bits, and a corresponding code length is 1024. Similarly, a CB (2) includes subdata 2 and a CRC corresponding to the subdata 2, a size of the CB 2 is 192 bits, and a corresponding code length is 512. Other CBs are deduced by analogy. Optionally, for a CB (5), redundant information may be added to form a CB whose data length is 24 bits, and a CRC (20) bits) included in a CB (7) is used to check subdata 5 and the redundant information, or is used to check subdata 5.

Specific implementations of other segmentation manners are not listed herein one by one.

Figures 11, 12, 13:
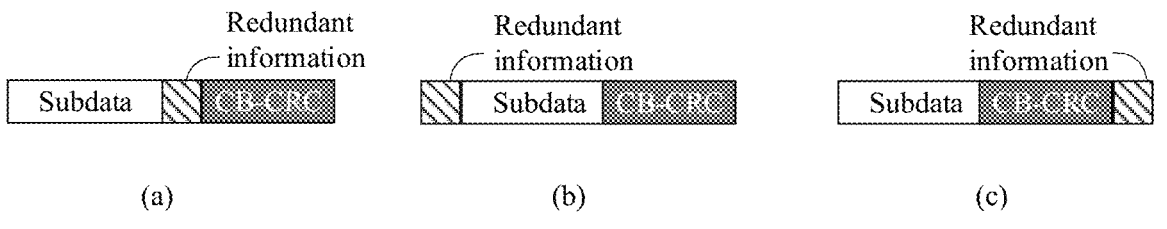
FIG. 11 is a schematic diagram of location design of redundant information according to an embodiment of this application.
FIG. 12 is a diagram of a structure of a transmission unit according to an embodiment of this application.
FIG. 13 is a diagram of a structure of another transmission unit according to an embodiment of this application.

Optionally, the CB may include redundant information, so that the formed CB meets a code length. The redundant information may be a segment of data that is predefined, preconfigured, or negotiated. For example, the redundant information may be 0) or 1 of a plurality of bits. Further, optionally, there may be a plurality of designs for a location of the redundant information. FIG. 11 is a schematic diagram of some possible location designs of redundant information. As shown in (a) in FIG. 11, a location of the redundant information may be after subdata and before a check code. As shown in (b) in FIG. 11, a location of the redundant information may be a front part of the CB. As shown in (c) in FIG. 11, a location of the redundant information may be a rear part of the CB.

In a possible design, there is a correspondence between the target check code addition manner and one or more of the following information: a communication channel type, a communication scenario type, a channel quality indication, a communication capability of a node, a code rate, or a radio frame type. The communication capability of the node (which may also be referred to as a capability of the node) may include one or more of the following aspects: a check code addition manner supported by the node, a check capability of the node, and the like, and include indication information for the aspects.

Optionally, a correspondence between a check code addition manner and the foregoing information may be predefined, preconfigured, or negotiated. Optionally, the correspondence may be represented by one or more of a table, a stack, a database, a queue, or another form. The following uses a table form as an example to describe a possible case of a correspondence between the target check code addition manner and the foregoing information.

Case 1: Table 2 shows an example of a possible correspondence between a type of a communication channel and a check code addition manner according to an embodiment of this application. It can be learned that, in a broadcast channel, a check code may be added in the check code addition manner 3. In a downlink control channel, a check code may be added in the check code addition manner 2. Other cases are shown in Table 2.

TABLE 2

| Correspondence between a type of a communication channel and a check code addition manner | |
|---|---|
| Type of a communication channel | Check code addition manner |
| Broadcast channel (broadcast link) | Check code addition manner 3 |
| Common channel | Check code addition manner 3 |
| Multicast channel | Check code addition manner 3 |
| Downlink control channel | Check code addition manner 2 |
| Downlink data channel | Check code addition manner 1 |
| System management frame | Check code addition manner 3 |
| . . . | . . . |

Case 2: Table 3 shows an example of a possible correspondence between a communication scenario type (or a transmission unit type, for example, a frame type) and a check code addition manner according to an embodiment of this application. It can be learned that, in a video call scenario, a check code may be added in the check code addition manner 1. In a scenario of viewing a short video, a check code may be added in the check code addition manner 1. Other cases are shown in Table 3.

TABLE 3

| Correspondence between a communication scenario type and a check code addition manner | |
|---|---|
| Communication scenario type or frame type | Check code addition manner |
| Video call | Check code addition manner 1 |
| Short video viewing | Check code addition manner 1 |
| Recording data uploading | Check code addition manner 2 |

TABLE 3-continued

| Correspondence between a communication scenario type and a check code addition manner | |
|---|---|
| Communication scenario type or frame type | Check code addition manner |
| Searching for a nearby Bluetooth device | Check code addition manner 3 |
| Keyboard and mouse application | Check code addition manner 3 |
| Common coverage scenario | Check code addition manner 2 |
| Low delay scenario | Check code addition manner 3 |
| Extended coverage scenario | Check code addition manner 2 |
| Long frame format | Check code addition manner 2 |
| Short frame format | Check code addition manner 3 |
| . . . | . . . |

Case 3: Different check code addition manners are used for different radio frame types.

A radio frame is a time unit carrying a symbol, and a time length of one radio frame is a multiple of a basic time unit. For example, the time length of one radio frame is represented as Tf, and Tf-640×Ts. Different symbols in radio frames are used for data transmission between nodes. For example, one radio frame may include one or more symbols, one or more switching intervals, and the like.

There are a plurality of radio frame types, and different radio frame types correspond to different check code addition manners. In a possible example, a correspondence between a radio frame type and a check code addition manner may be shown in Table 4-1. When a radio frame type 2 is used, the check code addition manner 1 is used to add a check code. When a radio frame type 3 or a radio frame type 4 is used, the check code addition manner 3 is used to add a check code.

TABLE 4-1

| Correspondence between a radio frame type and a check code addition manner | |
|---|---|
| Radio frame type | Check code addition manner |
| Radio frame type 1 | . . . |
| Radio frame type 2 | Check code addition manner 1 |
| Radio frame type 3 | Check code addition manner 3 |
| Radio frame type 4 | Check code addition manner 3 |
| . . . | . . . |

It should be understood that the correspondence shown in Table 4-1 is merely an example. In a specific implementation process, there may be another case for the correspondence between the radio frame type and the check code addition manner. A design of the correspondence between the radio frame type and the check code addition manner is not strictly limited in this application.

Further, the radio frame type may be predefined or pre-configured by a vendor, a user, a management device (or an administrator), or the like, for example, specified by a protocol. For example, Table 4-2 is an information table of a radio frame type. It can be learned that for different radio frame types, carried information may be different and duration or quantities of bits occupied by the information may be different. Using a radio frame type 2 as an example, in the radio frame type 2, a time length of a preamble signal is 10 microseconds ($\mu$s), and a length of a synchronization sequence is 64 bits. In a radio frame type 3, a time length of a preamble signal is 12 microseconds ($\mu$s), and a length of a synchronization sequence is (31+31) bits. Certainly, other information, such as physical layer control information, physical layer data information, an integrity protection field, or a cyclic redundancy check field, may also have different designs in a modulation scheme, a segmentation manner, and the like. Details are not described herein.

TABLE 4-2

| Radio frame type and description thereof | | |
|---|---|---|
| Radio frame type | Carried information | . . . |
| . . . | . . . | |
| Radio frame type 2 | Preamble signal (10 $\mu$s), 64-bit synchronization sequence, physical layer control information, physical layer data information, integrity protection field (optional), and cyclic redundancy check field | |
| Radio frame type 3 | Preamble signal (12 $\mu$s), 31 + 31-bit synchronization sequence, physical layer control information, physical layer data information, integrity protection field (optional), and cyclic redundancy check field | |
| Radio frame type 4 | Preamble signal (16 $\mu$s), 64 + 64-bit synchronization sequence, physical layer control information, physical layer data information, integrity protection field (optional), and cyclic redundancy check field | |
| . . . | . . . | . . . |

It should be understood that the radio frame type shown in Table 4-2 is merely an example. In a specific implementation process, the radio frame may carry more or less information, or some information may be designed as information. Information carried in a radio frame type and a detailed design of the information are not strictly limited in this application.

In some possible implementations, different services need to be transmitted by using radio frames of different radio frame types, or different radio frame types are used in different communication scenarios. Because different services or different communication scenarios have different requirements for transmission efficiency and transmission reliability, a radio frame type is corresponding to a check code addition manner, and a check code addition manner applicable to a corresponding service or communication scenario may be used for a specific radio frame type, to meet transmission requirements in different services or different scenarios, and improve network service quality.

Case 4: An example in which a channel quality indication is a signal-to-noise ratio is used. Table 5 shows a possible correspondence between a signal-to-noise ratio level and a check code addition manner according to an embodiment of this application. If a current signal-to-noise ratio falls within a range corresponding to a first signal-to-noise ratio level, the check code addition manner 1 is used: if a current signal-to-noise ratio falls within a range corresponding to a second signal-to-noise ratio level, the check code addition manner 2 is used; and other cases are deduced by analogy.

TABLE 5

Correspondence between a signal-to-noise ratio level and a check code addition manner

| Signal-to-noise ratio level | Signal-to-noise ratio range | Check code addition manner |
|---|---|---|
| First level | <-5 | Check code addition manner 1 |
| Second level | [-5, 5) | Check code addition manner 2 |
| Third level | [5, 15) | Check code addition manner 2 |
| . . . | . . . | . . . |

Case 5: The second node may notify the first node of a check code addition manner supported by the second node. The first node determines the target check code addition manner from the check code addition manner supported by the second node. Optionally, if the second node supports only one check code addition manner, only the one check code addition manner can be used in subsequent communication. Optionally, if the second node supports at least two check code addition manners, the target check code addition manner may be obtained through negotiation, or based on a priority, or in another manner.

Further, optionally, a first node and a second node may negotiate a to-be-used check code addition manner in a process of establishing a connection. Alternatively, the transmit end or the receive end notifies a peer end of a check code addition manner that should be used.

In conclusion, the target check code addition manner used by the first node is a check code addition manner supported by the receive end (for example, the second node).

Case 6: For different code rates, different check code addition manners may be used. For example, when a code rate is ¾, the check code addition manner 1 is used: when a code rate is ½, the check code addition manner 2 is used; or when a code rate is ¼, the check code addition manner 2 is used. Optionally, the code rate herein is a code rate of a frame header (or control information) part.

The foregoing cases 1 to 6 are example descriptions for ease of understanding of this solution, and are not intended to limit an existence form of the correspondence, a check code addition manner corresponding to a specified channel, and a check code addition manner corresponding to a specified code rate.

In another possible design, there is a correspondence between the segmentation manner and one or more of the following information: a communication channel type, a communication scenario type, a channel quality indication, a communication capability of a node, or a code rate. For related descriptions and possible cases, refer to the foregoing descriptions of the check code addition manner.

In a possible implementation, the first node may send first indication information, where the first indication information indicates the target check code addition manner in the plurality of check code addition manners. Optionally, there may be a plurality of possible designs for an occasion of sending the first indication information. For example, the first indication information may be sent when a communication connection is established between a transmit node and a receive end, or may be sent after a connection is established, or may be sent when specific information is transmitted. Optionally, the first indication information is sent by using signaling. Alternatively, optionally, the first indication information is carried in a header of a frame. The frame is a possible transmission unit. Further, the second indication information may be transmitted by using one or more fields in the frame header.

In another possible implementation, the first node may send second indication information, where the second indication information indicates the target segmentation manner in the plurality of segmentation manners. For an occasion for sending the second indication information and a sending manner, refer to the foregoing check code addition manner. FIG. 12 is a schematic diagram of a structure of a transmission unit. For example, the transmission unit may include a preamble, a header, a data part (or referred to as valid data or a payload), another field, or the like. For example, the preamble may be used to implement frequency synchronization, symbol timing estimation (STE), automatic gain control (AGC), and the like. The data part may include, for example, valid data (or referred to as payload). The header includes a check code addition manner indication field and/or a segmentation manner indication field, and another field. The check code addition manner indication field indicates the target check code addition manner, the segmentation manner indication field indicates the target segmentation manner, and the another field may indicate, for example, a type of a data unit, a type of a device address for sending data, a type of a device address for receiving data, and a quantity of bytes of valid data. Optionally, the transmission unit may further include a synchronization channel, an access address, a connection interval (CI), an algorithm terminator (termination, TERM), or the like that is not shown.

For example, Table 6 describes a value of a possible check code addition manner indication field according to an embodiment of this application. When the check code addition manner indication field is 00, the check code addition manner 1 is indicated. Other cases are shown in Table 5.

TABLE 6

Value of a check code addition manner indication field and corresponding description

| Value (3 bits) | Description |
|---|---|
| 00 | Check code addition manner 1 |
| 01 | Check code addition manner 2 |
| 10 | Check code addition manner 3 |
| 11 | Reserved |

For example, Table 7 describes a value of a possible segmentation manner indication field according to an embodiment of this application. When the segmentation manner indication field is 000, the segmentation manner 1 is indicated. Other cases are shown in Table 6.

US 12,580,681 B2

37

TABLE 7

Value of a segmentation manner indication
field and corresponding description

| Value (3 bits) | Description |
|---|---|
| 000 | Segmentation manner 1 |
| 001 | Segmentation manner 2 |
| 010 | Segmentation manner 3 |
| 011 | Segmentation manner 4 |
| 100 | Segmentation manner 5 |
| 101-111 | Reserved |

In another possible implementation, the first indication information and the second indication information may be same indication information. FIG. 13 is a schematic diagram of a structure of another transmission unit. A check code addition manner indication field indicates the target check code addition manner and the segmentation manner. For example, the check code addition manner may be related to the segmentation manner. If the check code addition manner 1 is used, a corresponding segmentation manner is the segmentation manner 1. For another example, Table 8 describes a value of a possible check code addition manner indication field according to an embodiment of this application. When the segmentation manner indication field is 0x000, the check code addition manner 1 and the segmentation manner 1 are indicated. Other cases are shown in Table 8.

TABLE 8

Value of a check code addition manner indication field and
corresponding description

| Value (16 bits) | Description |
|---|---|
| 0x000 | Check code addition manner 1 and segmentation manner 1 |
| 0x002 | Check code addition manner 2 and segmentation manner 1 |
| 0x003 | Check code addition manner 3 and segmentation manner 1 |
| 0x004 | Check code addition manner 1 and segmentation manner 2 |
| 0x005 | Check code addition manner 2 and segmentation manner 2 |
| . . . | . . . |

S302: The first node generates at least one codeword based on the M CBs.

Specifically, the first node encodes the M CBs to generate the at least one codeword. For example, one CB is encoded to form one codeword.

In a possible design, a coding scheme is polar code encoding.

For example, after obtaining the M CBs, the transmit end device may further perform one or more of operations such as bit mapping, higher order modulation, or symbol interleaving. A sequence of operations such as encoding the M CBs, bit mapping, higher order modulation, or symbol interleaving is not specifically limited. For example, these operations may be performed once, or may be performed sequentially, or may be performed in parallel.

In a possible implementation, after one or more of the foregoing operations are completed, codewords of the M CBs form a complete sequence. Codewords of first code blocks and codewords of second code blocks in the sequence may be arranged in an arrangement order. Optionally, the arrangement order may be preconfigured, preset, or defined by a protocol. Alternatively, optionally, the arrangement order may be sent by the transmit end to the receive end, so that the receive end device can obtain the M code blocks based on the order.

S303: The first node sends the at least one codeword.

Specifically, the first node may include the codewords of the M code blocks in a transmission unit, and send the transmission unit through a channel. The codewords of the M code blocks may be presented as a data sequence in the transmission unit. For ease of description, the data sequence is referred to as second data.

Correspondingly, the second node receives the at least one codeword. Optionally, the second node may receive the at least one codeword in the following manner: The second node receives the second data, and the second node segments the second data to obtain the codewords corresponding to the M code blocks, to obtain the at least one codeword.

In a design, the second node segments, in the target segmentation manner in the plurality of segmentation manners, the second data to obtain the codewords corresponding to the M code blocks.

Optionally, the target segmentation manner is indicated by using the second indication information. For example, the second node receives the indication information from the first node, to determine the target segmentation manner.

Optionally, when receiving the second data, the second node may perform one or more of operations such as bit mapping and demodulation. A sequence of operations such as bit mapping and demodulation is not specifically limited in this application.

S304: The second node processes the at least one codeword in the target check code addition manner in the plurality of check code addition manners, to obtain information about the first TB.

Optionally, the information about the first TB includes one or more of the following information: the first TB, a check result of the first TB, subdata corresponding to at least one CB, a check result of at least one CB, subdata corresponding to at least one code block group (coded block group, CBG), or a check result of at least one CBG. The check result may include one or more of check success indication information, check failure indication information, or a check failure data bit. A CBG is a group including one or more CBs, and may be used as a data unit for operations such as encoding, decoding, check, or retransmission in some scenarios.

It may be understood that the first node processes the first TB in the target check code addition manner to obtain the M code blocks, and then obtains the at least one codeword based on the M code blocks. Correspondingly, the second node decodes the at least one codeword to obtain the M code blocks, and checks, in the target check code addition manner by using a check code of corresponding data, whether the data is correctly transmitted.

In a case, when checking the CB, the second node may obtain subdata corresponding to the CB when the check succeeds, or may further obtain indication information indicating that the CB is successfully checked. When the check fails, indication information indicating that the CB fails to be checked may be obtained.

In another case, the second node performs check in a form of a CBG. The second node may obtain subdata corresponding to a CBG when the check succeeds, or may further obtain indication information indicating that the CBG is successfully checked. When the check fails, indication information indicating that the CBG fails to be checked may be obtained.

In another case, when all the M CBs are checked to be correctly transmitted, the TB may be checked based on the N pieces of subdata. The TB is checked by using the check code corresponding to the TB. When the check succeeds, the TB may be obtained, or indication information indicating that the TB is successfully checked is further obtained. When the check fails, indication information indicating that the TB fails to be checked may be obtained.

In a possible design, the second node decodes the at least one codeword to obtain the M code blocks. The second node checks, in the target check code addition manner based on a check code of corresponding data, whether the data is correctly transmitted. The following lists several possible implementations.

Implementation 1: The target check code addition manner is the addition manner 1. For the M CBs, the second node checks, based on the second CRC included in each CB, whether the subdata included in each CB is correctly transmitted. For example, as shown in FIG. 4, for the CB (1), the CRC included in the CB (1) is used to check whether the subdata 1 is correctly transmitted: for the CB (2), the CRC included in the CB (2) is used to check whether the subdata 2 is correctly transmitted; and other cases are deduced by analogy.

Further, when the N (in this case. N=M) pieces of subdata are correctly transmitted, the second node obtains, based on the N pieces of subdata, the first TB with the check code. The first TB with the check code includes the first TB and the first CRC. The second node checks the first TB based on the first CRC, to obtain the first TB or the check result of the first TB.

Implementation 2: The target check code addition manner is the addition manner 2. For the M1 second CBs, whether subdata corresponding to the first CB is correctly transmitted is checked based on a second CRC included in each first CB; and for the M2 second CBs, whether the N1 pieces of subdata are correctly transmitted is checked based on the third CRC.

For example, as shown in FIG. 5, for the CB (a1), the CRC included in the CB (a1) is used to check whether the subdata (a1) is correctly transmitted: for the CB (a2), the CRC included in the CB (a2) is used to check whether the subdata (a2) is correctly transmitted; and other first CBs are deduced by analogy. For the second CB, the CRC is used to check, based on the (N1) pieces of subdata that are of the one or more second CBs and that have check codes, whether the N1 pieces of subdata are correctly transmitted, to determine whether the subdata is correctly transmitted.

Further, when the M1 pieces of subdata corresponding to the M1 second CBs are correctly transmitted and the N1 pieces of subdata are correctly transmitted, the first TB with the check code is obtained based on the M1 pieces of subdata and the N1 pieces of subdata. The first TB with the check code includes the first TB and the first CRC. The second node checks the first TB based on the first CRC, to obtain the first TB or the check result of the first TB.

Implementation 3: The target check code addition manner is the addition manner 3. The second node obtains, based on the M CBs, the first TB with the check code. The first TB with the check code includes the first TB and the first CRC. The second node checks the first TB based on the first CRC, to obtain the first TB or the check result of the first TB.

In the embodiment shown in FIG. 3, the first node may determine the target check code manner from the plurality of check code addition manners, and add a check code to a TB (and/or subdata of the TB) in the target check code manner. Because the check code addition manner can be flexibly determined, a check code addition manner applicable to a current scenario can be determined in different transmission scenarios. This improves transmission performance.

For example, when data is transmitted by using a broadcast channel, there is no need to add a check code to subdata of a transport block. This increases a code rate, improves data transmission efficiency; and reduces a delay.

For another example, when channel quality is good, there may be no need to add a check code to subdata of a transport block. This improves data transmission efficiency.

For another example, in some scenarios, a check code may be added to a transport block, a check code is separately added to some subdata, and all the other subdata may jointly correspond to one check code. This improves flexibility of adding a check code and improves data transmission efficiency.

Embodiment 2

Refer to FIG. 14. FIG. 14 is a schematic flowchart of a communication method according to an embodiment of this application. Optionally, the method may be applied to the communication system in FIG. 2. The communication method shown in FIG. 14 includes at least step S1401 to step S1404, which are specifically as follows:

S1401: A first node obtains first data based on a first TB in a target segmentation manner in a plurality of segmentation manners, where the first data includes M CBs. The first data includes M CBs, and M is a positive integer.

Specifically, the first TB is to-be-transmitted data. To reduce an encoding/decoding delay and power consumption, the first TB may be segmented to obtain the M CBs. In some designs, the first node may first obtain a check code of the first TB through calculation, to obtain the first TB with the check code. The first node segments the first TB with the check code to obtain the M CBs. In this embodiment of this application, segmentation on the first TB is described. The first TB may carry a check code, or may not carry a check code, and segmentation is not necessarily performed based on the first TB.

The segmentation manner indicates a segmentation rule for the first TB, and different segmentation manners indicate different segmentation rules, different quantities of obtained CBs, or different code lengths. The first node may segment the first TB in the target segmentation manner in the plurality of segmentation manners, to form a CB. It should be understood that the CB may include some data of the first TB (referred to as subdata below for ease of description), or may include both subdata and a check code corresponding to the subdata, or may include only a check code corresponding to subdata. The plurality of check code addition manners may be predefined or preconfigured. For example, the plurality of check code addition manners are defined by using a protocol. Alternatively, when a node is delivered from a factory, the plurality of check code addition manners are written into the node. Alternatively, the plurality of check code addition manners are configured in a node by using a communication interface.

For a related segmentation manner, refer to the several possible segmentation manners listed in step S301. Details are not described herein again.

In another possible design, there is a correspondence between the target segmentation manner and one or more of the following information: a communication channel type, a communication scenario type, a channel quality indication, a communication capability of a node, or a code rate. Optionally, a correspondence between the target segmentation manner and the foregoing information may be predefined, preconfigured, or negotiated. For a related description, refer to the description in step S301.

Optionally, the correspondence may be represented by one or more of a table, a stack, a database, a queue, or another form. The following uses a table form as an example to describe a possible case of determining the target check code addition manner.

Case 1: Table 9 shows an example of a possible correspondence between a type of a communication channel and a segmentation manner according to an embodiment of this application. It can be learned that because the broadcast channel does not have a high requirement on a delay, the TB may be segmented in the segmentation manner 3 on the broadcast channel, to improve segmentation efficiency. For another example, in the downlink control channel, segmentation may be performed in the segmentation manner 1, so that a delay can be reduced, and user experience can be improved. Other cases are shown in Table 8.

TABLE 9

| Correspondence between a type of a communication channel and a segmentation manner | |
|---|---|
| Type of a communication channel | Segmentation manner |
| Broadcast channel | Segmentation manner 3 |
| Common channel | Segmentation manner 3 |
| Multicast channel | Segmentation manner 3 |
| Downlink control channel | Segmentation manner 1 |
| Downlink data channel | Segmentation manner 1 |
| . . . | . . . |

Case 2: Table 10 shows an example of a possible correspondence between a communication scenario type and a segmentation manner according to an embodiment of this application. It can be learned that, in a video call scenario, segmentation may be performed in the segmentation manner 1, to reduce a delay, and improve user experience. In a scenario of uploading recording data, segmentation may be performed in the segmentation manner 3. Other cases are shown in Table 9.

TABLE 10

| Correspondence between a communication scenario type and a check code addition manner | |
|---|---|
| Communication scenario type | Check code addition manner |
| Video call | Check code addition manner 1 |
| Short video viewing | Check code addition manner 1 |
| Recording data uploading | Check code addition manner 3 |
| Searching for a nearby Bluetooth device | Check code addition manner 3 |
| . . . | . . . |

For related descriptions of a channel quality indication, a code rate, and the like, refer to descriptions in case 3 and case 5 in step S301. Details are not described herein.

In a possible design, the second node may notify the first node of a segmentation manner supported by the second node. The first node determines the target segmentation manner from the segmentation manner supported by the second node. Optionally, if the second node supports only one segmentation manner, only the one segmentation manner can be used in subsequent communication. Optionally, if the second node supports at least two segmentation manners, a to-be-used segmentation manner may be obtained through negotiation, or based on a priority, or in another manner. Further, optionally, the first node and the second node may negotiate a to-be-used segmentation manner in a process of establishing a connection. Alternatively, during each time of communication, the transmit end or the receive end notifies a peer end of a segmentation manner that should be used.

In conclusion, the target segmentation manner used by the first node is a segmentation manner supported by the receive end (for example, the second node).

Optionally, the first node may send second indication information, where the second indication information indicates the target segmentation manner in the plurality of segmentation manners. For an actual manner of sending the second indication information, refer to related descriptions in step S301.

Optionally, for a possible manner of adding a check code to a TB and/or subdata, refer to related descriptions of the manner of adding a check code in step S301.

S1402: The first node generates at least one codeword based on the M code blocks.

For related descriptions, refer to the descriptions in step S302. Details are not described herein again.

S1403: The first node sends the at least one codeword.

Specifically, the first node may include the codewords of the M code blocks in a transmission unit, and send the transmission unit through a channel. The codewords of the M code blocks may be presented as a data sequence in the transmission unit. For ease of description, the data sequence is referred to as second data.

S1404: The second node receives the at least one codeword.

Correspondingly, the second node receives the at least one codeword. Specifically, the second node receives second data, and the second node segments the second data to obtain the codewords corresponding to the M code blocks, to obtain the at least one codeword.

In a design, the second node segments, in the target segmentation manner in the plurality of segmentation manners, the second data to obtain the codewords corresponding to the M code blocks.

Optionally, the target segmentation manner is indicated by using the second indication information. For example, the second node receives the indication information from the first node, to determine the target segmentation manner.

Optionally, when receiving the second data, the second node may perform one or more of operations such as bit mapping and demodulation. A sequence of operations such as bit mapping and demodulation is not specifically limited in this application.

Optionally, the method shown in FIG. 14 may further include step S1405. Details are as follows.

S1405: The second node processes the at least one codeword, to obtain information about the first TB.

Specifically, the second node decodes the at least one codeword to obtain the M code blocks. When the M code blocks and/or the first TB are/is corresponding to a check code, whether data is correctly transmitted is checked by using a check code of the corresponding data.

For a related description, refer to the related description in step S304.

The foregoing method supports a plurality of TB segmentation manners. When the transport block is segmented, the transmit end may determine the target segmentation manner from the plurality of segmentation manners, and segment the TB in the target segmentation manner. Because the segmentation manner can be flexibly determined, a segmentation manner applicable to a current scenario can be determined in different transmission scenarios. This improves transmission performance.

The foregoing describes in detail the method in embodiments of this application. The following provides an apparatus in embodiments of this application.

It may be understood that, to implement the functions in the foregoing method embodiments, a plurality of apparatuses provided in embodiments of this application, for example, a communication apparatus, include a corresponding hardware structure, a corresponding software unit, or a combination of a hardware structure and a software structure for performing the functions. A person skilled in the art should be easily aware that, with reference to the example units and algorithm steps described in the embodiments disclosed in this specification, embodiments of this application can be implemented in a form of hardware or a combination of hardware and computer software. Whether a function is performed by hardware or hardware driven by computer software depends on particular applications and design constraints of the technical solutions. A person skilled in the art may implement the foregoing method embodiments by using different apparatus implementations in different usage scenarios. It should not be considered that different implementations of the apparatus go beyond the scope of embodiments of this application.

In embodiments of this application, the apparatus may be divided into function units. For example, the function units may be obtained through division based on corresponding functions, or two or more functions may be integrated into one function unit. The integrated module may be implemented in a form of hardware, or may be implemented in a form of a software function unit. It should be noted that division into the units in embodiments of this application is an example, and is merely logical function division. In actual implementation, there may be another division manner.

This application enumerates a possible communication apparatus, as shown in FIG. 15. The communication apparatus 150 is configured to implement the foregoing communication method, for example, the signal processing method in the embodiment in FIG. 3 or FIG. 14.

In a possible implementation, the communication apparatus 150 may include a processing unit 1501 and a communication unit 1502. The processing unit 1501 may be configured to implement functions such as processing, generation, or calculation in the foregoing communication method, for example, S301 or S302, and/or configured to support another process described in the foregoing method. The communication unit 1502 may be configured to perform receiving and/or sending operations in the foregoing communication method, for example, S303, and/or configured to support another process described in the foregoing method, for example, a process of sending indication information or receiving indication information. In some possible implementation scenarios, the communication unit 1502 may be alternatively replaced with a communication interface module and/or a transceiver module, and the interface module and/or the transceiver module may be configured to support another process of the technology described in the foregoing method.

In a possible design, the communication apparatus 150 is configured to implement the method on the first node side in the embodiment shown in FIG. 3.

In a possible implementation, the processing unit 1501 is configured to:

process a first TB in a target check code addition manner in a plurality of check code addition manners, to obtain first data, where the first data includes M CBs, the plurality of check code addition manners are predefined or preconfigured, and M is a positive integer; and generate at least one codeword based on the M code blocks.

The communication unit 1502 is configured to send the at least one codeword.

In a possible implementation, the communication unit 1502 is further configured to send first indication information, where the first indication information indicates the target check code addition manner in the plurality of check code addition manners.

Optionally, the first indication information may be sent when a communication connection is established between a transmit node and a receive end, or may be sent after a connection is established, or may be sent when specific information is transmitted.

In a possible implementation, the first indication information is sent by using signaling.

In a possible implementation, the first indication information is carried in a header of a frame. The frame is a transmission unit. The header of the frame is also referred to as a frame header, and may include one or more fields. Specifically, the first indication information may be transmitted by using a field in the frame header.

In a possible implementation, there is a correspondence between the target check code addition manner and one or more of the following information: a communication channel type, a communication scenario type, a channel quality indication, a communication capability of a node, a code rate, or a radio frame type.

In a possible implementation, the target check code addition manner is a check code addition manner supported by a node on a receive side. In a design, the receive end may feed back, to the transmit end, a check code addition manner supported by the receive end, and the transmit end determines the target check code addition manner from the check code addition manner supported by the receive end.

In a possible implementation, the correspondence is predefined, preconfigured, or negotiated.

In a possible implementation, the target check code addition manner is a first check code addition manner in the plurality of check code addition manners:

the first TB and a first cyclic redundancy check CRC jointly correspond to N pieces of subdata, the first CRC is a CRC corresponding to the first TB, and N is a positive integer;

the M CBs include M1 first CBs, each first CB includes one piece of subdata and a second CRC, the second CRC is a CRC corresponding to the one piece of subdata, and M120; and the M CBs include M2 second CBs, the M2 second CBs correspond to N1 pieces of subdata and a third CRC, the third CRC is a CRC jointly corresponding to the N1 pieces of subdata, M2≥0, and N1≥0.

In a possible implementation, a code length corresponding to the first CB is a first code length; and a code length corresponding to the second CB is a second code length, and the first code length is different from the second code length.

In a possible implementation, M2+N1=N.

In a possible implementation, the M CBs include M3 third CBs, the M3 third CBs correspond to N2 pieces of subdata, the third CB does not include a CRC, M3>0, and N220.

In a possible implementation, the target check code addition manner is a second check code addition manner in the plurality of check code addition manners; and the first TB and a first CRC jointly correspond to the M CBs, and the first CRC is a CRC corresponding to the first TB.

In a possible implementation, the target check code addition manner is a third check code addition manner in the plurality of check code addition manners:

the first TB and a first CRC of the first TB jointly correspond to M pieces of subdata, and the first CRC is a CRC corresponding to the first TB; and each of the M CBs includes one piece of subdata and a second CRC, and the second CRC is a CRC corresponding to the one piece of subdata.

In a possible implementation, the processing unit 1501 is further configured to:

add the first CRC to the first TB in the target check code addition manner in the plurality of check code addition manners, to obtain a TB with a check code; and segment the TB with the check code in a target segmentation manner in a plurality of segmentation manners, to obtain the M CBs.

In a possible implementation, the segmentation operation is implemented at an object layer of wireless communication.

In a possible implementation, the target segmentation manner is a first segmentation manner in the plurality of segmentation manners; and the M CBs include at least one third CB, and a code length corresponding to the third CB is a shortest code length in a plurality of predefined code lengths.

In a possible implementation, the target segmentation manner is a second segmentation manner in the plurality of segmentation manners.

The M CBs do not necessarily include a third CB. A code length corresponding to the third CB is a shortest code length in a plurality of predefined code lengths.

For example, if the plurality of predefined code lengths are {1024, 512, 256, 128, 64}, the M CBs may include a CB whose corresponding code length is 64, or may not include a CB whose corresponding code length is 64.

In a possible implementation, a code length of any one of the M CBs is greater than a shortest code length in a plurality of predefined code lengths.

In a possible implementation, code lengths corresponding to the M CBs are related to a length of the TB. For example, if a data length of the first TB is a first data length, a code length corresponding to any one of the M CBs is greater than a shortest code length in a plurality of predefined code lengths; or if a data length of the first TB is a second data length, the M CBs include at least one third CB, and a code length corresponding to the third CB is a shortest code length in a plurality of predefined code lengths.

In a possible implementation, the communication unit 1502 is further configured to: send second indication information, where the second indication information indicates the target segmentation manner in the plurality of segmentation manners.

Optionally, the second indication information may be sent when a communication connection is established between a transmit node and a receive end, or may be sent after a connection is established, or may be sent when specific information is transmitted.

In a possible implementation, the second indication information is sent by using signaling.

In a possible implementation, the second indication information is carried in a header of a frame. The frame is a possible transmission unit. Further, the second indication information may be transmitted by using one or more fields in the frame header.

In a possible implementation, a code length L corresponding to the CB satisfies the following equation:

$$L=2^n, \text{ where } n \text{ is a natural number.}$$

In a possible implementation, a code length corresponding to the CB is one or more of predefined code lengths, and the predefined code lengths include at least one of 1024, 512, 256, 128, 64, or the like.

In a possible design, the communication apparatus 150 is configured to implement the method on the second node side in the embodiment shown in FIG. 3.

In a possible implementation, the communication unit 1502 is configured to receive at least one codeword.

The processing unit 1501 is configured to process the at least one codeword in a target check code addition manner in a plurality of check code addition manners, to obtain information about a first TB, where the plurality of check code addition manners are predefined or preconfigured.

In another possible implementation, the information about the first TB includes one or more of the following information: the first TB, a check result of the first TB, subdata corresponding to at least one CB, a check result of at least one CB, subdata corresponding to at least one CBG, or a check result of at least one CBG.

In another possible implementation, the communication unit 1502 is further configured to: receive first indication information, where the first indication information indicates the target check code addition manner in the plurality of check code addition manners.

In another possible implementation, the communication unit 1502 is further configured to receive the first indication information by receiving signaling.

In another possible implementation, the first indication information is carried in a header of a frame. The frame is a transmission unit. The header of the frame is also referred to as a frame header, and may include one or more fields. Specifically, the first indication information may be transmitted by using a field in the frame header.

In another possible implementation, there is a correspondence between the target check code addition manner and one or more of the following information: a communication channel type, a communication scenario type, a channel quality indication, a communication capability of a node, a code rate, or a radio frame type.

In another possible implementation, the correspondence is predefined, preconfigured, or negotiated.

In another possible implementation, the target check code addition manner is a check code addition manner supported by a receive end in the plurality of check code addition manners. In a design, the receive end may feed back, to the transmit end, a check code addition manner supported by the receive end, and the transmit end determines the target check code addition manner from the check code addition manner supported by the receive end.

In another possible implementation, the processing unit 1501 is further configured to:

obtain M CBs based on the at least one codeword, where M is a positive integer; and check the M CBs in the target check code addition manner in the plurality of check code addition manners, to obtain the information about the first TB.

In another possible implementation, the first TB and a first cyclic redundancy check CRC jointly correspond to N pieces of subdata, the first CRC is a CRC corresponding to the first TB, and N is a positive integer:

the M CBs include M1 first CBs, each first CB includes one piece of subdata and the first CRC, the first CRC corresponds to the one piece of subdata, and M1>0; and the M CBs include M2 second CBs, the M2 second CBs correspond to N1 pieces of subdata and a third CRC, the third CRC is a CRC jointly corresponding to the N1 pieces of subdata, M2>0, and N1≥0.

In another possible implementation, the processing unit 1501 is further configured to:

for the M1 second CBs, check, based on a second CRC included in each first CB, whether subdata corresponding to the first CB is correctly transmitted; and for the M2 second CBs, check, based on the third CRC, whether the N1 pieces of subdata are correctly transmitted.

In another possible implementation, the processing unit 1501 is further configured to:

when M1 pieces of subdata corresponding to the M1 second CBs are correctly transmitted and the N1 pieces of subdata are correctly transmitted, obtain a first TB with a check code based on the M1 pieces of subdata and the N1 pieces of subdata, where the first TB with the check code includes the first TB and the first CRC; and check the first TB based on the first CRC, to obtain the first TB or the check result of the first TB.

In another possible implementation, a code length corresponding to the first CB is a first code length; and a code length corresponding to the second CB is a second code length, and the first code length is different from the second code length.

In another possible implementation, M2+N1=N.

In another possible implementation, the M CBs include M3 third CBs, the M3 third CBs correspond to N2 pieces of subdata, the third CB does not include a CRC, M3≥0, and N2≥0.

In another possible implementation, the first TB and a first CRC jointly correspond to the M CBs, and the first CRC is a CRC corresponding to the first TB.

In another possible implementation, the processing unit 1501 is further configured to:

obtain a first TB with a check code based on the M CBs, where the first TB with the check code includes the first TB and the first CRC; and check the first TB based on the first CRC, to obtain the first TB or the check result of the first TB.

In another possible implementation, the first TB and a first cyclic redundancy check CRC of the first TB jointly correspond to M pieces of subdata; and each CB includes one piece of subdata and a second CRC corresponding to the one piece of subdata.

In another possible implementation, the processing unit 1501 is further configured to:

for the M CBs, check, based on the second CRC included in each CB, whether the subdata included in each CB is correctly transmitted:

when the M pieces of subdata are correctly transmitted, obtain a first TB with a check code based on the M pieces of subdata, where the first TB with the check code includes the first TB and a first CRC; and check the first TB based on the first CRC, to obtain the first TB or the check result of the first TB.

In another possible implementation, the M CBs are obtained in a target segmentation manner in a plurality of segmentation manners.

In another possible implementation, the target segmentation manner is a first segmentation manner in the plurality of segmentation manners; and the M CBs include at least one third CB, and a code length corresponding to the third CB is a shortest code length in a plurality of predefined code lengths.

In another possible implementation, the target segmentation manner is a second segmentation manner in the plurality of segmentation manners.

The M CBs do not necessarily include a third CB. A code length corresponding to the third CB is a shortest code length in a plurality of predefined code lengths.

For example, if the plurality of predefined code lengths are {1024, 512, 256, 128, 64}, the M CBs may include a CB whose corresponding code length is 64, or may not include a CB whose corresponding code length is 64.

In a possible implementation, a code length of any one of the M CBs is greater than a shortest code length in a plurality of predefined code lengths.

In a possible implementation, code lengths corresponding to the M CBs are related to a length of the TB. For example, if a data length of the first TB is a first data length, a code length corresponding to any one of the M CBs is greater than a shortest code length in a plurality of predefined code lengths; or if a data length of the first TB is a second data length, the M CBs include at least one third CB, and a code length corresponding to the third CB is a shortest code length in a plurality of predefined code lengths.

In another possible implementation, the communication unit 1502 is further configured to: receive second indication information, where the second indication information indicates the target segmentation manner in the plurality of segmentation manners.

In another possible implementation, the communication unit is further configured to receive the second indication information by receiving signaling.

In another possible implementation, the second indication information is carried in a header of a frame. The frame is a transmission unit. Optionally, the second indication information may be specifically transmitted by using a field in the frame header.

In another possible implementation, a code length L corresponding to the CB satisfies the following equation:

$$L=2^n, \text{ where } n \text{ is a natural number.}$$

In another possible implementation, a code length corresponding to the CB is one or more of predefined code lengths, and the predefined code lengths include at least one of 1024, 512, 256, 128, 64, or the like.

In a possible design, the communication apparatus 150 is configured to implement the method on the first node side in the embodiment shown in FIG. 14.

In a possible implementation, the processing unit 1501 is configured to:

obtain first data based on a first TB in a target segmentation manner in a plurality of segmentation manners, where the first data includes M CBs, the plurality of segmentation manners are predefined or preconfigured, and M is a positive integer; and generate at least one codeword based on the M code blocks.

The communication unit 1502 is configured to send the at least one codeword.

Optionally, the communication apparatus is a communication node, or the communication apparatus is a component in a communication node.

In another possible implementation, the foregoing method is implemented at an object layer of wireless communication.

In another possible implementation, the target segmentation manner is a first segmentation manner in the plurality of segmentation manners; and the M CBs include at least one third CB, and a code length corresponding to the third CB is a shortest code length in a plurality of predefined code lengths.

In another possible implementation, the target segmentation manner is a second segmentation manner in the plurality of segmentation manners.

The M CBs do not necessarily include a third CB. A code length corresponding to the third CB is a shortest code length in a plurality of predefined code lengths.

For example, if the plurality of predefined code lengths are {1024, 512, 256, 128, 64}, the M CBs may include a CB whose corresponding code length is 64, or may not include a CB whose corresponding code length is 64.

In a possible implementation, a code length of any one of the M CBs is greater than a shortest code length in a plurality of predefined code lengths.

In a possible implementation, code lengths corresponding to the M CBs are related to a length of the TB. For example, if a data length of the first TB is a first data length, a code length corresponding to any one of the M CBs is greater than a shortest code length in a plurality of predefined code lengths; or if a data length of the first TB is a second data length, the M CBs include at least one third CB, and a code length corresponding to the third CB is a shortest code length in a plurality of predefined code lengths.

In another possible implementation, the communication unit 1502 is further configured to: send second indication information, where the second indication information indicates the target segmentation manner in the plurality of segmentation manners.

Optionally, the second indication information may be sent when a communication connection is established between a transmit node and a receive end, or may be sent after a connection is established, or may be sent when specific information is transmitted.

In another possible implementation, the second indication information is sent by using signaling.

In another possible implementation, the second indication information is carried in a header of a frame. The frame is a transmission unit. Optionally, the second indication information may be specifically transmitted by using a field in the frame header.

In another possible implementation, a code length L corresponding to the CB satisfies the following equation:

$$L=2^n,\text{ where } n \text{ is a natural number.}$$

In another possible implementation, a code length corresponding to the CB is one or more of predefined code lengths, and the predefined code lengths include at least one of 1024, 512, 256, 128, 64, or the like.

In another possible implementation, there is a correspondence between the target segmentation manner and one or more of the following information: a communication channel type, a communication scenario type, a channel quality indication, or a communication capability of a node.

In another possible implementation, the target segmentation manner is a segmentation manner supported by a receive end. In a design, the receive end may feed back, to the transmit end, a segmentation manner supported by the receive end, and the transmit end determines the target segmentation manner from the segmentation manner supported by the receive end.

In another possible implementation, the correspondence is predefined, preconfigured, or negotiated.

In a possible design, the communication apparatus 150 is configured to implement the method on the second node side in the embodiment shown in FIG. 14.

In a possible implementation, the communication unit 1502 is configured to receive second data in a target segmentation manner in a plurality of segmentation manners, to obtain at least one codeword, where the plurality of segmentation manners are predefined or preconfigured.

The processing unit 1501 is configured to process the at least one codeword to obtain information about a first TB.

In a possible implementation, the communication unit 1502 is further configured to receive the second data.

The processing unit 1501 is further configured to obtain the at least one codeword based on the second data in the target segmentation manner in the segmentation manners.

In another possible implementation, the at least one codeword corresponds to M CBs.

In another possible implementation, the foregoing method is implemented at an object layer of wireless communication.

In another possible implementation, the M CBs include at least one third CB, and a code length corresponding to the third CB is a shortest code length in a plurality of predefined code lengths.

In another possible implementation, a code length corresponding to any one of the M CBs is greater than a shortest code length in a plurality of predefined code lengths.

In another possible implementation, the communication unit 1502 is further configured to: receive second indication information, where the second indication information indicates the target segmentation manner in the plurality of segmentation manners.

Optionally, the second indication information may be received when a communication connection is established between a transmit node and a receive end, or may be received after a connection is established, or may be received when specific information is transmitted.

In another possible implementation, the communication unit 1502 is further configured to receive the second indication information by receiving signaling.

In another possible implementation, the second indication information is carried in a header of a frame. The frame is a transmission unit. Optionally, the second indication information may be specifically transmitted by using a field in the frame header.

In another possible implementation, a code length L corresponding to the CB satisfies the following equation:

$$L=2^n,\text{ where } n \text{ is a natural number.}$$

In another possible implementation, a code length corresponding to the CB is one or more of predefined code lengths, and the predefined code lengths include at least one of 1024, 512, 256, 128, 64, or the like.

In another possible implementation, there is a correspondence between the target segmentation manner and one or more of the following information: a communication channel type, a communication scenario type, a channel quality indication, or a communication capability of a node.

In another possible implementation, the target segmentation manner is a segmentation manner supported by a receive end. In a design, the receive end may feed back, to the transmit end, a segmentation manner supported by the receive end, and the transmit end determines the target segmentation manner from the segmentation manner supported by the receive end.

In another possible implementation, the correspondence is predefined, preconfigured, or negotiated.

Figure 16:
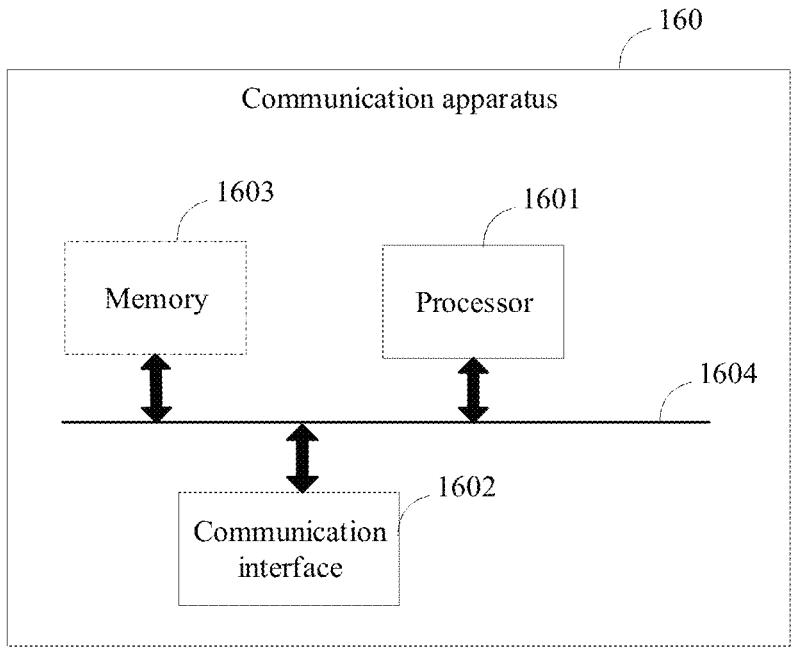
FIG. 16 is a schematic diagram of a structure of another communication apparatus according to an embodiment of this application.

Refer to FIG. 16. FIG. 16 is a schematic diagram of a structure of a communication apparatus 160 according to an embodiment of this application. The communication apparatus 160 may be a node, or may be a component (for example, a chip, a software module, or a hardware module) in a node. The communication apparatus 160 may include at least one processor 1601. Optionally, a communication interface 1602 may be further included. Further, optionally, the communication apparatus 160 may further include at least one memory 1603. Further, optionally, a bus 1604 may be further included. The processor 1601, the communication interface 1602, and the memory 1603 are connected by using the bus 1604.

The processor 1601 is a module that performs an arithmetic operation and/or a logic operation, and may be specifically one or a combination of processing modules such as a central processing unit (CPU), a graphics processing unit (GPU), a microprocessor unit (MPU), an application-specific integrated circuit (ASIC), a field programmable gate array (FPGA), a complex programmable logic device (CPLD), a coprocessor (which assists the central processing unit in completing corresponding processing and application), a microcontroller unit (MCU), and the like.

The communication interface 1602 may be configured to provide an information input or output for the at least one processor; and/or The communication interface 1602 may be configured to receive data sent from the outside and/or send data to the outside, and may be a wired link interface including an Ethernet cable or the like, or may be a wireless link (Wi-Fi. Bluetooth, universal wireless transmission, an in-vehicle short-range communication technology: another short-range wireless communication technology, or the like) interface. Optionally, the communication interface 1602 may further include a transmitter (for example, a radio frequency transmitter or an antenna), a receiver, or the like coupled to the interface.

The memory 1603 is configured to provide storage space, and the storage space may store data such as an operating system and a computer program. The memory 1603 may be one or a combination of a random access memory (RAM), a read-only memory (ROM), an erasable programmable read-only memory (EPROM), a compact disc read-only memory (CD-ROM), or the like.

At least one processor 1601 in the communication apparatus 160 is configured to perform the foregoing communication method, for example, the method described in the embodiment in FIG. 3 or FIG. 14. For related content, refer to the foregoing description. Details are not described herein again.

Optionally, the processor 1601 may be a processor (referred to as a dedicated processor for ease of differentiation) specially configured to perform the methods, or may be a processor that performs the methods by invoking a computer program, for example, a general-purpose processor. Optionally, the at least one processor may further include both a dedicated processor and a general-purpose processor. Optionally, when the communication apparatus 160 includes at least one processor 1601, the computer program may be stored in the memory 1603.

This application provides a chip. The chip may include a processor and an interface. The processor is configured to read instructions by using the interface, to perform the method according to any one of the first to fourth aspects.

This application further provides a computer-readable storage medium. The computer-readable storage medium stores instructions. When the instructions are run on at least one processor, the foregoing communication method is implemented, for example, the method in FIG. 3 or FIG. 14.

This application further provides a computer program product. The computer program product includes computer instructions. When the computer instructions are executed by a computing device, the foregoing communication method is implemented, for example, the method in FIG. 3 or FIG. 14.

In embodiments of this application, words such as "example" or "for example" are used to represent giving examples, illustrations, or descriptions. Any embodiment or design solution described as "example" or "for example" in this application should not be construed as being more preferred or advantageous than other embodiments or design solutions. Specifically, the words such as "example" or "for example" are used to present related concepts in a specific manner.

In embodiments of this application, "at least one" refers to one or more, and "a plurality of" refers to two or more. "At least one of the following items (pieces)" or a similar expression thereof refers to any combination of these items, including a single item (piece) or any combination of a plurality of items (pieces). For example, at least one of a, b, or c may represent a, b, c, (a and b), (a and c), (b and c), or (a, b, and c), where a, b, and c may be singular or plural. The term "and/or" describes an association relationship of associated objects, and indicates that three relationships may exist. For example, A and/or B may indicate the following three cases: Only A exists, both A and B exist, and only B exists. A and B may be singular or plural. The character "/" generally indicates an "or" relationship between associated objects.

In addition, unless otherwise specified, ordinal numbers such as "first" and "second" used in embodiments of this application are used to distinguish between a plurality of objects, and are not used to limit a sequence, a time sequence, priorities, or importance of the plurality of objects. For example, a first device and a second device are merely for ease of description, and do not indicate a difference between the first device and the second device in terms of a structure, a degree of importance, and the like. In some embodiments, the first device and the second device may alternatively be a same device.

As used in the foregoing embodiments, according to the context, the term "when" may be interpreted as "if", "after", "in response to determining", or "in response to detecting". The foregoing descriptions are merely optional embodiments of this application, but are not intended to limit this application. Any modification, equivalent replacement, or improvement made without departing from the concept and principle of this application should fall within the protection scope of this application.

A person of ordinary skill in the art may understand that all or some of the steps of the embodiments may be implemented by hardware or a program instructing related hardware. The program may be stored in a computer-readable storage medium. The storage medium may be a read-only memory, a magnetic disk, an optical disc, or the like.

53

54

What is claimed is:

1. A communication method, comprising:
processing a first transport block (TB) in a target check code addition manner from among a plurality of check code addition manners, to obtain first data, wherein the first data comprises M code blocks (CBs), the plurality of check code addition manners are predefined or preconfigured, and M is a positive integer;
generating at least one codeword based on the M CBs; and sending the at least one codeword;
wherein the target check code addition manner is a first check code addition manner from among the plurality of check code addition manners;
wherein the first TB and a first cyclic redundancy check (CRC) correspond to N pieces of subdata, the first CRC is a CRC corresponding to the first TB, and N is a positive integer;
wherein the M CBs comprise M1 first CBs, each first CB of the M1 first CBs comprises one piece of subdata and a second CRC, the second CRC is a CRC corresponding to the one piece of subdata, and M1≥0; and
wherein the M CBs comprise M2 second CBs, the M2 second CBs correspond to N1 pieces of subdata and a third CRC, the third CRC is a CRC jointly corresponding to the N1 pieces of subdata, M2>0, and N1≥0.

2. The method according to claim 1, further comprising:
sending first indication information, wherein the first indication information indicates the target check code addition manner from among the plurality of check code addition manners.

3. The method according to claim 2, wherein the first indication information is carried in a header of a frame.

4. The method according to claim 1, wherein there is a correspondence between the target check code addition manner and one or more of the following information:
a communication channel type, a communication scenario type, a channel quality indication, a communication capability of a node, a code rate, or a radio frame type.

5. The method according to claim 4, wherein the correspondence is predefined, preconfigured, or negotiated.

6. The method according to claim 1, wherein the target check code addition manner is a check code addition manner supported by a receive end.

7. The method according to claim 1,
wherein a code length corresponding to the M1 first CBs is a first code length; and
wherein a code length corresponding to the M2 second CBs is a second code length, and wherein the first code length is different from the second code length.

8. A communication method, comprising:
receiving at least one codeword; and
processing the at least one codeword in a target check code addition manner from among a plurality of check code addition manners, to obtain information about a first transport block (TB), wherein the plurality of check code addition manners are predefined or preconfigured;
wherein the target check code addition manner is a first check code addition manner from among the plurality of check code addition manners;
wherein the first TB and a first cyclic redundancy check (CRC) correspond to N pieces of subdata, the first CRC is a CRC corresponding to the first TB, and N is a positive integer;
wherein the M code blocks (CBs) comprise M1 first CBs, each first CB of the M1 first CBs comprises one piece of subdata and a second CRC, the second CRC is a CRC corresponding to the one piece of subdata, and M1>0; and
wherein the M CBs comprise M2 second CBs, the M2 second CBs correspond to N1 pieces of subdata and a third CRC, the third CRC is a CRC jointly corresponding to the N1 pieces of subdata, M2>0, and N1≥0.

9. The method according to claim 8, wherein the information about the first TB comprises one or more of the following information:
the first TB, a check result of the first TB, subdata corresponding to at least one code CB, a check result of at least one CB, subdata corresponding to at least one code block group (CBG), or a check result of at least one CBG.

10. The method according to claim 8, further comprising:
receiving first indication information, wherein the first indication information indicates the target check code addition manner from among the plurality of check code addition manners.

11. The method according to claim 10, wherein the first indication information is carried in a header of a frame.

12. The method according to claim 8, wherein there is a correspondence between the target check code addition manner and one or more of the following information:
a communication channel type, a communication scenario type, a channel quality indication, a communication capability of a node, a code rate, or a radio frame type.

13. A communication apparatus, comprising:
at least one processor; and
a memory, wherein the at least one processor is configured to execute program instructions stored in the memory to perform operations comprising:
processing a first transport block (TB) in a target check code addition manner from among a plurality of check code addition manners, to obtain first data, wherein the first data comprises M code blocks (CBs), the plurality of check code addition manners are predefined or preconfigured, and M is a positive integer;
generating at least one codeword based on the M CBs; and sending the at least one codeword;
wherein the target check code addition manner is a first check code addition manner from among the plurality of check code addition manners;
wherein the first TB and a first cyclic redundancy check (CRC) correspond to N pieces of subdata, the first CRC is a CRC corresponding to the first TB, and N is a positive integer;
wherein the M CBs comprise M1 first CBs, each first CB of the M1 first CBs comprises one piece of subdata and a second CRC, the second CRC is a CRC corresponding to the one piece of subdata, and M1≥0; and
wherein the M CBs comprise M2 second CBs, the M2 second CBs correspond to N1 pieces of subdata and a third CRC, the third CRC is a CRC jointly corresponding to the N1 pieces of subdata, M2>0, and N1≥0.

14. The communication apparatus according to claim 13, wherein the operations further comprise:
sending first indication information, wherein the first indication information indicates the target check code addition manner from among the plurality of check code addition manners.

15. The communication apparatus according to claim 14, wherein the first indication information is carried in a header of a frame.

16. The communication apparatus according to claim 13, wherein there is a correspondence between the target check code addition manner and one or more of the following information:

a communication channel type, a communication scenario type, a channel quality indication, a communication capability of a node, a code rate, or a radio frame type.

17. The communication apparatus according to claim 16, wherein the correspondence is predefined, preconfigured, or negotiated.

18. The method according to claim 1, wherein M1+N1=N; or wherein the M CBs comprise M3 third CBs, the M3 third CBs correspond to M3 pieces of subdata, M3>0.

19. The method according to claim 8, wherein M1+N1=N; or wherein the M CBs comprise M3 third CBs, the M3 third CBs correspond to M3 pieces of subdata, M3>0.

20. The communication apparatus according to claim 13, wherein M1+N1=N; or wherein the M CBs comprise M3 third CBs, the M3 third CBs correspond to M3 pieces of subdata, M3>0.

* * * * *